(12) United States Patent
Farrahi Moghaddam et al.

(10) Patent No.: US 11,700,705 B2
(45) Date of Patent: Jul. 11, 2023

(54) METHOD, SYSTEM AND APPARATUS FOR ENABLING LIVE AND/OR HOT MIGRATION OF PHYSICAL RESOURCES

(71) Applicant: Telefonaktiebolaget LM Ericsson (publ), Stockholm (SE)

(72) Inventors: Fereydoun Farrahi Moghaddam, Brossard (CA); Reza Farrahi Moghaddam, Brossard (CA); Yves Lemieux, Kirkland (CA); Adriano Matos Pinheiro, L'Ile Bizard (CA); Mohamed Cheriet, Montreal (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 385 days.

(21) Appl. No.: 16/954,813

(22) PCT Filed: Dec. 20, 2017

(86) PCT No.: PCT/IB2017/058235
§ 371 (c)(1),
(2) Date: Jun. 17, 2020

(87) PCT Pub. No.: WO2019/122973
PCT Pub. Date: Jun. 27, 2019

(65) Prior Publication Data
US 2021/0100127 A1 Apr. 1, 2021

(51) Int. Cl.
*G06F 9/44* (2018.01)
*H05K 7/14* (2006.01)
(Continued)

(52) U.S. Cl.
CPC ......... *H05K 7/1498* (2013.01); *G06F 9/5072* (2013.01); *G06F 13/4081* (2013.01);
(Continued)

(58) Field of Classification Search
CPC .................................................... H05K 7/1498
(Continued)

(56) References Cited

U.S. PATENT DOCUMENTS 5,872,701 A 2/1999 Hayden, Sr. et al.
6,219,235 B1 4/2001 Diaz et al.
(Continued)

FOREIGN PATENT DOCUMENTS

EP 0 350 573 A1 4/1989
WO 2017/052673 A1 3/2017

OTHER PUBLICATIONS

International Search Report and Written Opinion dated Nov. 13, 2018 issued in PCT Application No. PCT/IB2017/058235, consisting of 24 pages.
(Continued)

*Primary Examiner* — Timothy A Mudrick
(74) *Attorney, Agent, or Firm* — Christopher & Weisberg, P.A.

(57) ABSTRACT

A resource circuit board is configured for use by a physical migration system, the resource circuit board including at least one common interface shaped and configured to connect to an interconnect of a base circuit board; and at least one migration-support interface the at least one common interface being different from the at least one migration-support interface, the at least one migration-support interface: shaped to connect to at least one corresponding migration-support interface of the physical migration system; and configured to provide at least one of power and connectivity to the resource circuit board during a physical migration of the resource circuit board.

21 Claims, 16 Drawing Sheets

(51) Int. Cl.
*G06F 9/50* (2006.01)
*H05K 1/11* (2006.01)
*G06F 13/40* (2006.01)

(52) U.S. Cl.
CPC ........... *H05K 1/117* (2013.01); *H05K 7/1402* (2013.01); *H05K 7/1492* (2013.01)

(58) Field of Classification Search
USPC ........................................................ 718/104
See application file for complete search history.

(56) References Cited

U.S. PATENT DOCUMENTS

| | | | |
|---|---|---|---|
| 6,577,905 B1 * | 6/2003 | Robertson | H04L 41/0816 710/118 |
| 6,980,435 B2 | 12/2005 | Shum et al. | |
| 7,725,212 B2 | 5/2010 | Prasse | |
| 8,025,515 B2 | 9/2011 | Diaz | |
| 8,254,124 B2 | 8/2012 | Keisling et al. | |
| 8,582,299 B1 | 11/2013 | Phillips et al. | |
| 9,095,078 B2 | 7/2015 | Chainer et al. | |
| 9,391,716 B2 | 7/2016 | Shin et al. | |
| 9,588,929 B2 | 3/2017 | Fang | |
| 9,596,136 B2 | 3/2017 | Mo et al. | |
| 10,855,650 B2 | 12/2020 | Farrahi Moghaddam et al. | |
| 2016/0262283 A1 * | 9/2016 | Phillips | G06F 1/181 |
| 2016/0363966 A1 | 12/2016 | Davis et al. | |
| 2017/0099190 A1 | 4/2017 | Pitwon et al. | |

OTHER PUBLICATIONS

International Preliminary Report on Patentability dated Jul. 2, 2020 issued in PCT Application No. PCT/IB2017/058235, consisting of 14 pages.
INFORMA USA, Inc Data Center Knowledge; The Role of Robotics in Data Center Automation; Dec. 13, 2018, consisting of 6 pages.
Evan Kirstel; Applications Synchronization in the New Network Functions Virtualization (NVF) World, May 1, 2017, consisting of 3 pages.
Park Place Technologies; Robots Coming Soon to a Data Center Near You; Aug. 2013, consisting of 4 pages.
European Communication Pursuant to Article 94(3) EPC dated Jan. 28, 2022 issued in corresponding European Application No. 17 832 096.6, consisting of 9 pages.
Cutress, Ian, Aquantia Launch AQtion 5G/2.5G/1G Multi-Gigabit Ethernet Cards (NICs) for PCIe; https://www.anandtech.com/show/11368/aquantia-launch-aqtion-5g25g1g-nics; Jul. 29, 2022, consisting of 7 pages.
Dreier, Roland, The Advantages of NVMe with //X: An Architect's Perspective, PureStorage: https://blog.purestorage.com/products/the-advantages-of-nvme-with-x-an-architects-perspective/; Jul. 29, 2022, consisting of 6 pages.
EchoStreams Innovative Solutions, EchoStreans Delivers the World's Fastest 2U NVMe Platform at Computex 2017: The Ultra-High Density, Hot-Swappable FlacheSAN Series; http://www.businesswire.com/news/home/20170529005312/en/EchoStreams-Delivers-World%E2%80%99s-Fastest-2U-NVMe-Platform; May 29, 2017, consisting of 3 pages.
Ericsson, Future Digital Infrastructure, https://www.ericsson.com/hyperscale/future-digital-infrastructure; Jul. 29, 2022, consisting of 10 pages.
Ramseyer, Chris, "PCIe 5.0 To Be Finalized In 2019; PCI-SIG Fast Tracks Final Spec"; http://www.tomshardware.com/news/pcie-5.0-release-0.3,34720.html; Jul. 29, 2022, consisting of 15 pages.

* cited by examiner

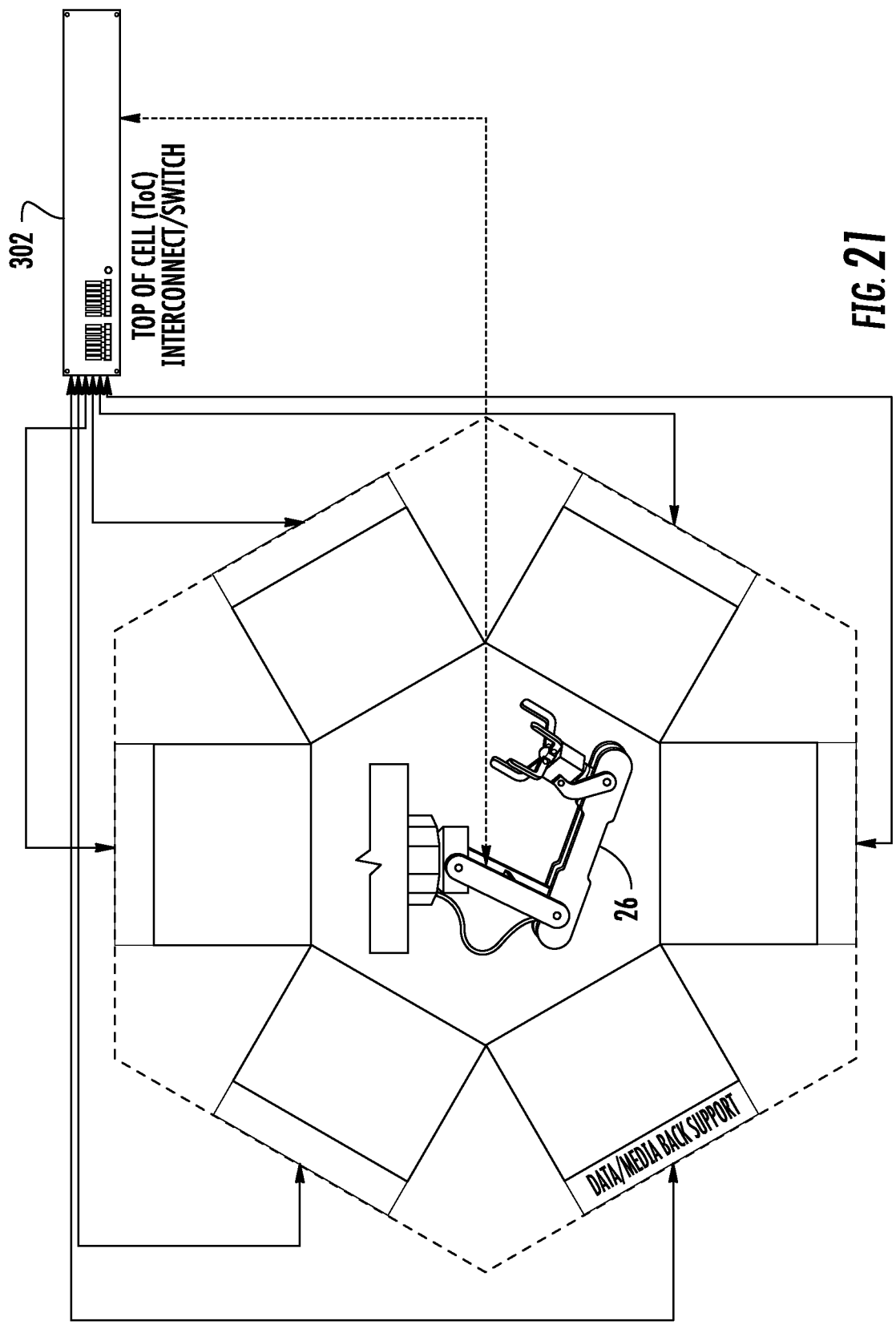

METHOD, SYSTEM AND APPARATUS FOR ENABLING LIVE AND/OR HOT MIGRATION OF PHYSICAL RESOURCES

CROSS-REFERENCE TO RELATED APPLICATIONS

This application is a Submission Under 35 U.S.C. § 371 for U.S. National Stage Patent Application of International Application Number: PCT/IB2017/058235, filed Dec. 20, 2017 entitled "METHOD, SYSTEM AND APPARATUS FOR ENABLING LIVE AND/OR HOT MIGRATION OF PHYSICAL RESOURCES," the entirety of which is incorporated herein by reference.

TECHNICAL FIELD

The present disclosure relates to migration of physical resources, and, in particular, to a method, system, and apparatus for live and/or hot migration of physical computing resources.

BACKGROUND

Data centers, and more precisely Compute Centers, play a key role in many aspects of information and communications technology (ICT), including, for example, the Internet of Things (IoT) area, which requires highly efficient small data centers at the "edge" of the computer network. Hyperscale computing and disaggregated hardware are set to be important enablers of cost reduction and flexibility in resource allocation, particularly in multi-tenant cases.

In consideration of the physical limitations associated with networks (e.g., signal transmission ranges and associated delays, etc.), the hierarchical arrangement of computing resources (e.g., central processing units (CPUs), random access memory (RAM), non-volatile memory (NVM), disks, etc.) have been designed and deployed in form factors such as racks, cabinets, and their sub-units (e.g., rack unit, sub-racks, chassis, etc.), and their super-units (e.g., point of delivery (POD), multiple-POD, etc.).

Disaggregated hardware has shown promising results toward removing capacity limitations at various levels, such as, for example, the limit on the number of CPUs that could be placed inside a chassis. Disaggregated hardware also provides the capability to define systems across units. For example, disaggregated hardware may provide the ability to define a single system across multiple chassis or across multiple PODs/cabinets). In some cases, different types of resources (e.g., CPUs versus RAMs, CPU versus storage (e.g., solid state drive, hard disk drive, etc.), or RAM versus storage) could be placed in different chassis such that the tenants' systems may be built using a mix-and-match of resources across those cabinets (e.g., virtual performance-optimized data centers). Although this seems to bring a level of abstraction and adaptability to data centers, it can also place an extra load on the backplane that interconnects components and carries traffic exchanged among the units, which may result in degradation in performance per unit of resource.

Peripheral Component Interconnects (PCIs), such as, for example, PCIe, are generally still the main approach to interconnecting CPUs to peripheral components, such as, networking, storage, and computing (e.g., graphics processing units—GPUs) and field-programmable gate arrays (FPGAs) in data center servers. With the introduction of new/emerging bus/interconnect standards, such as, for example, GenZ, Open Coherent Accelerator Processor Interface (OpenCAPI) and Cache Coherent Interconnect for Accelerators (CCIX), changes to interconnect technology may be on the forefront. In addition, the introduction of PCI Express 5.0 (PCIe) is expected to increase Ethernet speeds to as much as 400 Gb/s. Such advanced interconnect technologies may support advancements in artificial intelligence (AI) and machine learning for Big Data. The technology may also enable lower performance resources, such as, for example, NVM Express (NVMe) solid states drives (SSDs) to utilize fewer lanes to achieve higher speeds.

While these technological advancements may improve data center efficiencies, there are problems with existing solutions. For example, the resources in a disaggregated data center are not ubiquitously available. In other words, it is possible that in some cases the required 'physical' resource (e.g., computing, network, or storage resource) is not available at the destination of a migration. In those cases, the virtual migration would not be feasible at all due to the lack of the required or requested physical resource.

Migrations are useful for a variety of reasons. For example, a migration may improve the performance of the workflow of a solution. For complex workflows that involve more than one node in each 'instance' the timing in-between the nodes and also the timing of the workflow steps can be particularly critical in the workflow performance. The optical backplane may make these timing challenges unnoticeable. However, the load on the optical backplane of the datacenter (or even a cabinet) may itself become the bottleneck of the overall performance when, for example, all the resource units have been provisioned/allocated to tenants/users/etc. For example, the load of the optical backplane may become a bottleneck if the allocation ratio approaches the value of 1 (where the allocation ratio may be considered a ratio of the number of provisioned/allocated resource units to the total number of units). For underutilized data centers, the optical bandwidth could be seen as practically unlimited. However, a goal of disaggregated hardware is to help increase the level of efficiency in resource utilization in the data center. Thus, in preferred 'over-utilized' datacenters, the optical bandwidth may become a valuable resource to preserve and utilize efficiently.

In the case of physical migration, if a physical migration is required when an application is running, the physical resource(s) (e.g., compute, memory, storage, etc.) generally become unavailable and may even become stateless during the physical migration process. Thus, physical migration of resources can place more requirements on other resources or other parts of an application in order to handle the fluctuation in the capacities, or to return the migrated physical resource to the proper state after the migration. In some cases, services provided by the server may be required to cease while the physical resource(s) are being migrated, which is highly undesirable and can be very costly.

Existing data centers generally have a static or human-dependent mix of resources. For example, the mix of physical resources in a unit (e.g., a chassis) is conventionally determined at an initial acquisition time, such as, for example, when acquiring or determining a type of unit to be used in a cabinet. For example, with a conventional datacenter system cabinet, the mix of physical resources is generally determined when the type of sled to be used is decided. Conventionally, modification of the mix of resources in the chassis or sled would require human intervention. In other words, a human worker is conventionally called upon to change out the mix of resources in a unit, which can increase costs associated with managing and designing the data center and may increase the length of time that the physical resource(s) are unavailable due to the modification/physical migration. Unfortunately, human intervention can increase the complexity of physical migration due to the limitations of, for example, normal human working hours, requirements for designing resource structures for human access, limitations on human speed, accuracy, availability, and the like.

Also, because of the higher dependency on the optical backplane, the number of modifiable units (e.g., sleds) is generally limited (e.g., to four (4) sleds per chassis), which makes the "across-chassis" interconnect a part of the system and renders the limitations associated therewith an inevitable consequence when the systems scale up. Furthermore, integration of modified sub-units (e.g., sleds) would require additional processes as a consequence of an absence of a "base" for the systems.

Another drawback of existing data centers is that the traditional design of rows of cabinets results in suboptimal utilization of floor space, and therefore suboptimal operation of cooling systems.

SUMMARY

The present disclosure advantageously provides a method, apparatus, and system for enabling live and/or hot migration of physical resources. Advantageously, embodiments of the present disclosure allow hardware resources to be physically migrated, while continuing to be used in active, running workflows, even during the physical migration.

According to a first aspect, a resource circuit board configured for use by a physical migration system is provided. The resource circuit board includes at least one common interface shaped and configured to connect to an interconnect of a base circuit board; and at least one migration-support interface, the at least one common interface being different from the at least one migration-support interface. The at least one migration-support interface is shaped to connect to at least one corresponding migration-support interface of the physical migration system; and is configured to provide at least one of power and connectivity to the resource circuit board during a physical migration of the resource circuit board.

According to this aspect, in some embodiments, the physical migration system comprises at least one robotic member and the at least one corresponding migration-support interface of the physical migration system is at the at least one robotic member. In some embodiments, the at least one migration-support interface is configured to provide the at least one of power and connectivity to the resource circuit board during the physical migration of the resource circuit board. In some embodiments, the at least one migration-support interface is configured to provide the at least one of power and connectivity to the resource circuit board only during the physical migration of the resource circuit board. In some embodiments, the at least one common interface is arranged at least to support at least one application associated with at least one server utilizing the resource circuit board; and the at least one migration-support interface is arranged at least to support the physical migration of the resource circuit board. In some embodiments, the at least one migration-support interface is arranged at least to support at least one of a live and a hot physical migration of the resource circuit board. In some embodiments, the at least one common interface is shaped and configured to connect to a peripheral component interconnect of the base circuit board. In some embodiments, the resource circuit board is configured to switch a power supply to the resource circuit board from a common power supply to a migration-support power supply, the migration-support power supply supplying power to the resource circuit board via the at least one migration-support interface and the common power supply supplying power to the resource circuit board via the at least one common interface. In some embodiments, the at least one migration-support interface is disposed on a side of the resource circuit board that is different from a side of the resource circuit board on which the at least one common interface is disposed. In some embodiments, the at least one migration-support interface includes at least one migration-support power interface configured to provide power to the resource circuit board during the physical migration of the resource circuit board; and at least one migration-support connectivity interface configured to provide connectivity between the resource circuit board and at least one network connection at a data center during the physical migration of the resource circuit board.

In some embodiments, the at least one migration-support interface is configured to provide the at least one of power and connectivity to the resource circuit board during the physical migration of the resource circuit board via at least one of a wireless connection and a wired connection. In some embodiments, at least one migration-support interface comprises at least one migration-support identification interface configured with a unique identifier stored in non-transitory memory and readable by the interconnect of the base circuit board. In some embodiments, the resource circuit board is a printed circuit board with at least one of at least one memory resource, at least one storage resource, and at least one compute resource arranged at least to support at least one application associated with at least one server utilizing the resource circuit board. In some embodiments, the resource circuit board includes processing circuitry, the processing circuitry configured to: detect a connection of the at least one migration-support interface of the resource circuit board to the corresponding migration-support interface of the physical migration system; and as a result of detecting the connection of the at least one migration-support interface of the resource circuit board to the corresponding migration-support interface of the physical migration system, switching connectivity from the at least one common interface to the at least one migration-support interface of the resource circuit board. In some embodiments, switching connectivity from the at least one common interface to the at least one migration-support interface comprises at least changing at least one of at least one connectivity address and at least one port of the at least one common interface to at least one of at least one connectivity address and at least one port of the at least one migration-support interface as a result of detecting the connection. In some embodiments, switching connectivity from the at least one common interface to the at least one migration-support interface comprises terminating communication of data to the at least one common interface and instead communicating data to the at least one migration-support interface.

In some embodiments, switching connectivity from the at least one common interface to the at least one migration-support interface comprises participating in a handshake protocol with at least one data center network manager to switch the connectivity. In some embodiments, participation in the handshake protocol comprises at least clearing at least one buffer associated with the at least one common interface and, after clearing the at least one buffer, disabling the at least one common interface. In some embodiments, the processing circuitry is further configured to: detect a connection of the at least one common interface to at least one destination interconnect of a destination base circuit board; and as a result of detecting the connection of the of the at least one common interface to the at least one destination interconnect of the destination base circuit board: determine whether there is a connection to the migration-support interface; and as a result of determining that there is a connection to the migration-support interface and simultaneously a connection to the at least one common interface, switch connectivity between the at least one migration-support interface of the resource circuit board and the at least one common interface of the resource circuit board.

According to a second aspect, a physical migration system for use at a data center is provided. The physical migration system includes at least one movement member configured to physically migrate at least one resource circuit board from a first location to a second location, the at least one movement member having at least one migration-support interface. The at least one migration-support interface is shaped to connect to a corresponding migration-support interface of the at least one resource circuit board; and is configured to provide at least one of power and connectivity to the at least one resource circuit board during the at least one movement member's physical migration of the at least one resource circuit board. The at least one resource circuit board includes at least one common interface shaped and configured to connect to an interconnect of a base circuit board, the at least one common interface being different from the at least one corresponding migration-support interface.

According to this aspect, in some embodiments, the at least one movement member includes at least one robotic member. In some embodiments, the at least one common interface of the at least one resource circuit board is arranged at least to support at least one application associated with at least one server utilizing the at least resource circuit board; and the at least one migration-support interface of the at least one resource circuit board is arranged at least to support the physical migration of the at least one resource circuit board. In some embodiments, the physical migration system is configured to physically migrate the at least one resource circuit board within a radial arrangement of cabinets and the at least one movement member is disposed radially inward of the radial arrangement of cabinets. In some embodiments, the at least one migration-support interface of the at least one movement member is arranged at least to support at least one of a live and a hot physical migration of the at least one resource circuit board. In some embodiments, the at least one common interface of the at least one resource circuit board is shaped and configured to connect to a peripheral component interconnect of the base circuit board.

In some embodiments, the at least one resource circuit board is configured to switch a power supply from a common power supply to a migration-support power supply, the migration-support power supply supplying power to the resource circuit board via the at least one migration-support interface and the common power supply supplying power to the resource circuit board via the at least one common interface. In some embodiments, the at least one migration-support interface of the at least one resource circuit board is disposed on a side of the at least one resource circuit board that is different from a side of the at least one resource circuit board on which the at least one common interface is disposed. In some embodiments, the at least one migration-support interface of the at least one movement member includes at least one migration-support power interface configured to provide power to the at least one resource circuit board during the at least one movement member's physical migration of the at least one resource circuit board; and at least one migration-support connectivity interface configured to provide connectivity between the at least one resource circuit board and at least one network connection at a data center during the at least one movement member's physical migration of the resource circuit board. In some embodiments, the at least one migration-support interface of the at least one movement member is configured to provide the at least one of power and connectivity to the at least one resource circuit board during the at least one movement member's physical migration of the resource circuit board via at least one of a wireless connection and a wired connection. In some embodiments, the at least one migration-support interface of the at least one resource circuit board comprises at least one migration-support identification interface configured with a unique identifier stored in non-transitory memory and readable by the interconnect of the base circuit board. In some embodiments, the at least one resource circuit board includes at least one printed circuit board with at least one of at least one memory resource, at least one storage resource, and at least one compute resource arranged at least to support at least one application associated with at least one server utilizing the at least one resource circuit board.

In some embodiments, the at least one migration-support interface of the at least one movement member is configured to provide the at least one of power and connectivity to the resource circuit board only during the at least one movement member's physical migration of the resource circuit board. In some embodiments, the physical migration system includes processing circuitry, the processing circuitry configured to cause the at least one movement member to: move to a first location at a data center; connect the at least one migration-support interface of the at least one movement member to the corresponding migration-support interface of the at least one resource circuit board; move the connected at least one resource circuit board to a target location at the data center; and during the movement of the at least one resource circuit board to the target location, communicate data to the at least one migration-support interface of the at least one resource circuit board instead of communicating data to the at least one common interface of the at least one resource circuit board.

According to a third aspect, a method of physically migrating at least one resource circuit board is provided. The method includes connecting at least one migration-support interface of at least one resource circuit board to at least one corresponding migration-support interface of at least one movement member; at least a portion of the connected at least one movement member physically moving the at least one resource circuit board a distance from a first location to a target location; and during at least a portion of the physical movement, providing, via the connection of the at least one migration-support interface of at least one resource circuit board to the at least one corresponding migration-support interface of the at least one movement member, at least one of power and connectivity to the at least one resource circuit board.

According to this aspect, in some embodiments, the method further includes providing the at least one resource circuit board with at least one common interface, the at least one common interface being shaped and configured to connect to an interconnect of a base circuit board; and after the at least one movement member physically moves the at least one resource circuit board to the target location, connecting the at least one common interface of the at least one resource circuit board to the interconnect of the base circuit board and disconnecting the at least one migration-support interface, the at least one common interface being different from the at least one migration-support interface. In some embodiments, the at least the portion of the connected at least one movement member physically moving the at least one resource circuit board the distance from the first location to the target location comprises at least one robotic member physically moving the at least one resource circuit board the distance from the first location to the target location. In some embodiments, providing the at least one of power and connectivity to the at least one resource circuit board comprises the at least one robotic member providing the at least one of power and connectivity to the at least one resource circuit board during the at least the portion of the physical movement. In some embodiments, the at least one common interface is arranged at least to support at least one application associated with at least one server utilizing the at least one resource circuit board; and each of the at least one migration-support interface of the at least one resource circuit board and the at least one corresponding migration-support interface of the at least one movement member is arranged at least to support the physical migration of the resource circuit board. In some embodiments, each of the at least one migration-support interface of the at least one resource circuit board and the at least one corresponding migration-support interface of the at least one movement member is arranged at least to support at least one of a live and a hot physical migration of the resource circuit board. In some embodiments, connecting the at least one common interface of the at least one resource circuit board to the interconnect of the base circuit board comprises connecting the at least one common interface of the at least one resource circuit board to a peripheral component interconnect of the base circuit board.

In some embodiments, the method includes, after connecting the at least one migration-support interface of the at least one resource circuit board to the at least one corresponding migration-support interface of physical migration s system, switching a power supply for the at least one resource circuit board from a common power supply to a migration-support power supply, the migration-support power supply supplying power to the resource circuit board via the at least one migration-support interface. In some embodiments, connecting the at least one migration-support interface of the at least one resource circuit board to the at least one corresponding migration-support interface of the at least one movement member comprises connecting the at least one migration-support interface of the at least one resource circuit board to the at least one corresponding migration-support interface of the at least one movement member at a side of the at least one resource circuit board that is different from a side of the at least one resource circuit board on which the at least one common interface is disposed. In some embodiments, providing the at least one of power and connectivity to the at least one resource circuit board includes: providing power, via at least one migration-support power interface, to the at least one resource circuit board during the at least the portion of the physical movement; and providing connectivity, via at least one migration-support connectivity interface, between the at least one resource circuit board and at least one network connection at a data center during the at least the portion of the physical movement.

In some embodiments, the method further includes, as a result of connecting the at least one migration-support interface of the at least one resource circuit board to the at least one corresponding migration-support interface of the at least one movement member, switching connectivity from the at least one common interface to the at least one migration-support interface of the resource circuit board. In some embodiments, switching connectivity from the at least one common interface to the at least one migration-support interface comprises using at least one of at least one connectivity address and at least one port of the at least one migration-support interface of the at least one resource circuit board to communicate data, instead of using at least one of at least one connectivity address and at least one port of the at least one common interface of the at least one resource circuit board. In some embodiments, switching connectivity from the at least one common interface to the at least one migration-support interface comprises participating in a handshake protocol with at least one data center network manager and the at least one resource circuit board to switch the connectivity.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein:

FIG. 21 illustrates an exemplary arrangement of cabinets in the cell with a top-of-cell optical switch for network connectivity, according to one embodiment of the present disclosure.

DETAILED DESCRIPTION

Figure 1:
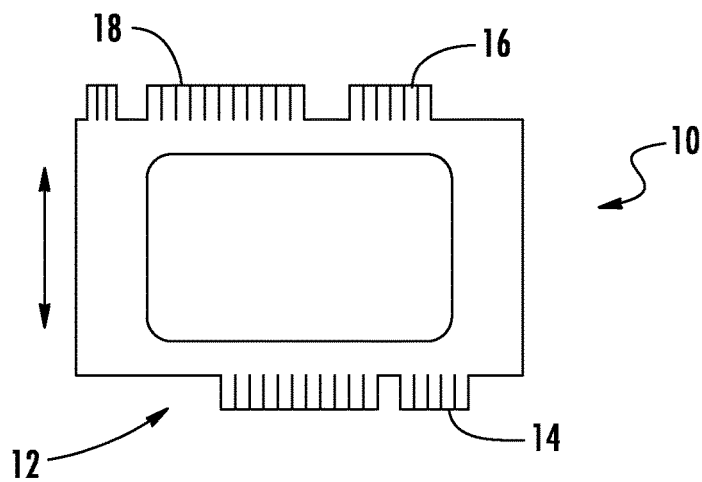
FIG. 1 is front, perspective view of an exemplary resource circuit board with edge interfaces, according to one embodiment of the present disclosure.

Before describing in detail exemplary embodiments, it is noted that the embodiments reside primarily in combinations of apparatus components and processing steps related to live and/or hot migration of physical circuit board resources.

Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Some embodiments described in the present disclosure provide a disaggregated compute solution at various scales from, for example, a cabinet to an entire data center. In one embodiment, a novel and inventive type of board is described that enables hot and/or live migration of physical resources, even if the physical resources are involved in running workflows. In some embodiments, these boards, referred to herein as a "resource circuit board," may have at least one type (or a combination of types) of resource(s), such as, for example, a compute resource, a storage resource, a network resource, and/or the like. In some embodiments, the resource circuit board may expose various "physical" and "logical" interfaces to the "hosting" boards (referred to herein as a "base circuit board"). In some embodiments, these physical and/or logical interfaces may be configured to connect to executing components of the proposed physical migration (e.g., a mechanical arm or robotic member).

In some embodiments, the combination of physical and logical interfaces enables hot and/or live physical migration of the resources (e.g., resource circuit board). In additional embodiments, such interfaces may also provide traceability/trackability of the resources, even in the case of a full or partial failure of a software tracking system. Spatial-locality awareness and convergence of resources, among other locality awareness/convergence may also be provided in embodiments of the present disclosure. Embodiments of the present disclosure may include a mechanically robotic arm configured to automate many actions related to adaptation and optimization of the configuration of tenant systems at a data center.

Embodiments of the present disclosure advantageously provide for hot and/or live physical migration of physical resources, even while the physical resources are being used in an active, running workflow.

Embodiments of the present disclosure are configured to maximize the utilization ratio in datacenters, especially disaggregated/heterogeneous datacenters, by avoiding the spread of the workflows across multiple cabinets or resolving those spreads in real-time and in a live manner that substantially reduces or eliminates the downtime during which the physical resource(s) are not available for use by tenant systems. In other words, embodiments of the present disclosure provide for use of the physical resource(s) by applications even during physical migration of such resource(s) from one location to another location at the data center.

Some embodiments of the present disclosure provide for hierarchal disaggregation with preservation of locality (e.g., spatial, among other forms of location indicators).

Some embodiments of the present disclosure provide for discrete elasticity, which may include each unit (e.g., chassis) being configured to be increased/decreased by increments of sub-units (e.g., resource circuit boards) of various resource types in an automated manner.

In one embodiment, the present disclosure may provide for instantaneous and/or remote elasticity. The increase/decrease of resource circuit boards to a tenant system may not be limited only to physical insertion of resource circuit boards in one of the associated units (e.g., chassis). In one embodiment, a resource circuit board may be assigned immediately in an available cabinet (even if it is actually located relatively far from the main cabinet for the tenant system), and subsequently the resource circuit board may be mechanically/physically migrated (or a substitute resource circuit board used) for the associated units (e.g., chassis) to induce a rapid spatial/locality convergence in the tenant systems. In other words, resources may be dynamically assigned on-the-fly and subsequently physically migrated so as to continuously converge resources assigned to tenant systems, thereby reducing the load on the optical backplane of the data center.

Some embodiments of the present disclosure may lower the temperature of the data center to, for example, 12 degrees Celsius, thereby improving performance in terms of better cooling due to the automated infrastructure of the physical migration system, with minimal human intervention.

Some embodiments of the present disclosure may provide for automatic, immediate integration, and tracking of connected resource circuit boards using unique Resource-board Access Control (RBAC) addresses, and/or unique resource board identifiers (ResID). Such embodiments may provide logical tracking mechanisms for resources.

Some embodiments of the present disclosure provide disaggregated hardware with automated spatial/location convergence.

In some embodiments of the present disclosure, a resource circuit board is provided with one or more secondary interfaces configured to support physical migration while enabling connectivity to the data center network during the physical migration. Such secondary interfaces may be in addition to the primary interface(s) that are conventionally provided on resource boards, such as, for example, PCIs. In some embodiments, these secondary interfaces may be provided primarily, or solely to support continued connectivity of the resource circuit board to the network during physical migration. In other words, in some embodiments, interruption in the availability of the migrating resource circuit board can be substantially reduced or eliminated.

Some embodiments of the present disclosure may include one or more cabinets, compute units, cells, and segments. In some embodiments, a cabinet may be considered a rack-shaped structure that supports and hosts a plurality of compute units. In some embodiments, the compute unit may be considered the smallest unit for a tenant system and may include a base circuit board, an optical and/or wire connection unit, an array of fans for cooling, and other support elements. In some embodiments, the base circuit board is configured to host the resource circuit board interconnect slots. In further embodiments, the base circuit board may also host an address registry for hosted resource circuit board addresses (e.g., RBACs). In some embodiments, the base circuit board may also include components for alignment signals for a movement member (e.g., robotic arm) of a physical migration system. In some embodiments, the cell may include n-cabinets arranged in a radial form. In some embodiments, the cell may be arranged as a hexagonal-shaped cell. In other embodiments, the cell may be arranged in other n-sided polygonal shapes. In some embodiments, the segment may be considered a cluster of a plurality of cells arranged together in a data center with optimal utilization of data center floor space. In some embodiments, a tenant system may be considered one or more instances of software applications associated with a server, typically in a cloud computing data center being shared by other tenant systems.

Referring now to the drawings, in which like reference designators refer to like elements, there is shown in FIGS. 1-21, an exemplary resource circuit board, and its related components, methods, and the like, constructed in accordance with the principles of the present disclosure, the exemplary resource circuit board being designated generally as "10." Referring to FIG. 1, the resource circuit board 10 may be an electronic circuit board that enables hot and/or live physical migration of the resource circuit board 10. In one embodiment, the resource circuit board 10 may be a printed circuit board with at least one of at least one memory resource (e.g., RAM), at least one storage resource (e.g., NVM), at least one compute resource (e.g., CPU, or other processors), at least one network resource (e.g., network card), and other resources. In one embodiment, the resource circuit board 10 may include optical connections. As used herein, the shortened term "resource board 10" may be used instead of "resource circuit board 10," for the sake of brevity.

Figure 2:
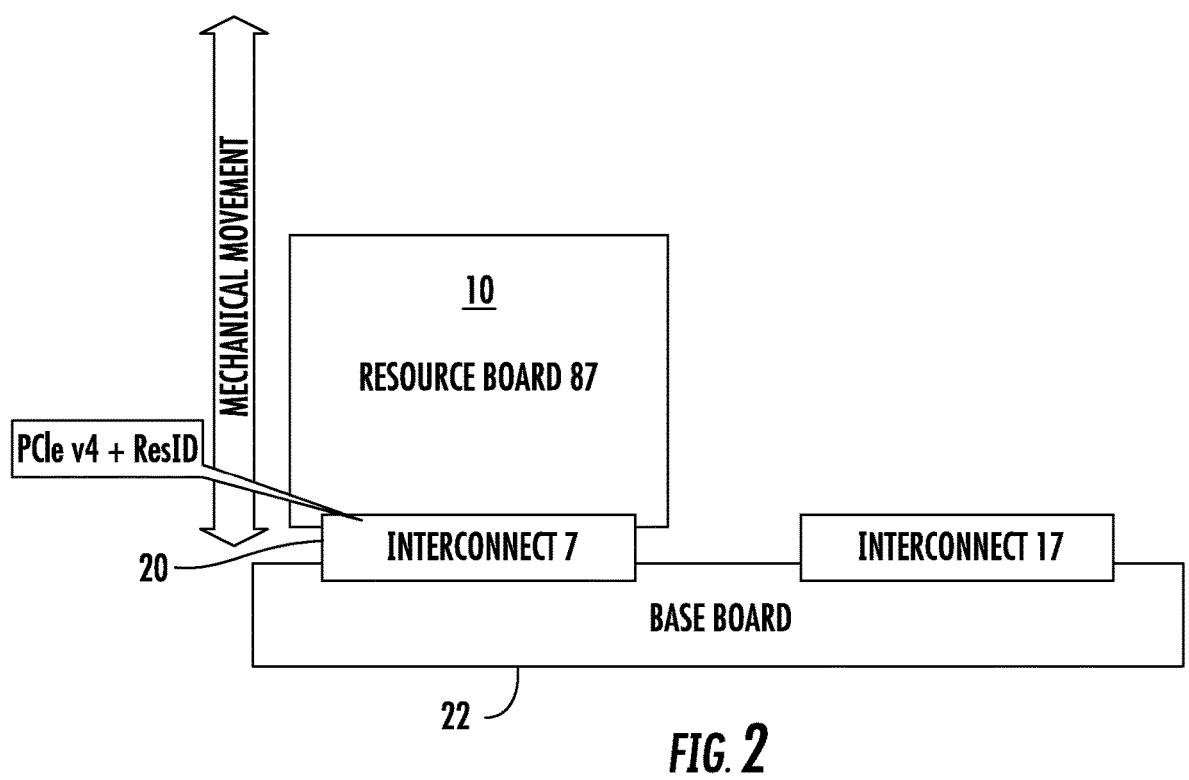
FIG. 2 is an elevational side view of the resource board of FIG. 1 connected to an exemplary interconnect of a base circuit board according to one embodiment of the present disclosure.

Referring now primarily to FIGS. 1 and 2, the resource board 10 may include one or more interfaces. In one embodiment, the resource board 10 may include a plurality of interfaces, including at least one common interfaces 12, at least one identification interfaces 14, at least one migration-support power interfaces 16, and at least one migration-support connectivity interface 18.

In one embodiment, the common interface 12 may be disposed on a common side of the resource board 10. The term "common" is used herein to indicate an interface, or side of the resource board 10 on which such common interface 12 is disposed. The common interface 12 may be configured for regular (non-migration) connections (e.g., PCI) to an interconnect 20 of a base circuit board 22 (see FIG. 2). In one embodiment, the common interface 12 is shaped and configured to connect to the interconnect 20 of the base circuit board 22 for normal (non-migration) use.

Figure 3:
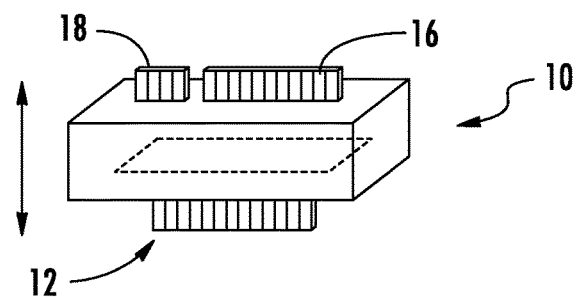
FIG. 3 is a front, perspective view of another exemplary resource circuit board with face interfaces, according to another embodiment of the present disclosure.

In one embodiment, the common interface 12 may be an edge of the resource board 10, as shown in FIG. 1, as in the case of conventional PCI interfaces. In another embodiment, the common interface 12 may be a face interface extending outwardly from and perpendicular to, i.e., orthogonal to, a face surface of the resource board 10, as shown in FIG. 3, for example. In yet other embodiments, the common interface 12 may be disposed on or may extend from other parts of the resource board 10. In one embodiment, the common interface 12 may be considered to provide the connection to the base circuit board 22.

In one embodiment, in addition to the common interface 12, the resource circuit board 10 may further include one or more extra interfaces, which may be considered migration-support interfaces that enable the proposed hot and/or live physical migration. Depending on the shared power specifications of electronic and/or optical components on the resource circuit board 10, there may be one unified or a set of migration-support power interfaces 16. The migration-support power interface(s) 16 may be disposed on another side or face of the resource board 10. In one embodiment, the migration-support power interface 16 may be disposed on a side of the resource board 10 that is different from the side of the resource board 10 on which the common interface 12 is disposed.

Figure 4:
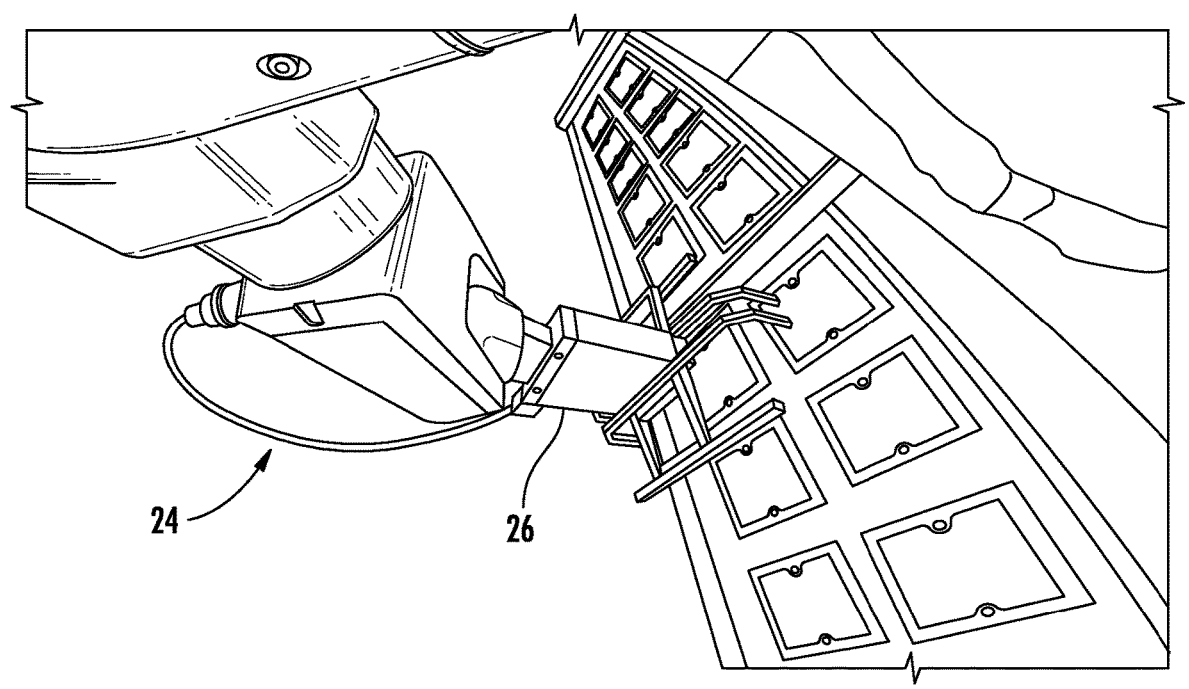
FIG. 4 is a perspective view of an exemplary robotic member and cabinet with face interfaces, according to one embodiment of the present disclosure.

Referring now primarily to FIGS. 1 and 4, in one embodiment, a physical migration system 24 may be provided with at least one movement member 26. The movement member 26 may be configured to physically engage the resource circuit board 10 and move the resource circuit board 10 to a target location. The singular term "the movement member 26" will be used herein; although it should be understood that such actions may also be performed by more than one movement member 26. In one embodiment, the physical migration system 24 may include compatible power interfaces configured to connect to the migration-support power interface 16 of the resource circuit board 10 to enable the hot physical migration. The term "hot" is intended to indicate that the resource circuit board 10 has power during its physical migration.

The physical migration system 24 may also include one or more connectivity interfaces configured to connect to the migration-support connectivity interface 18 of the resource circuit board 10 to enable the live physical migration. The term "live" is intended to indicate that the resource circuit board 10 is able to communicate and continue to be used by the application or server that the resource board 10 is assigned to. The migration-support connectivity interface 18 may be configured to provide connectivity of the resource circuit board 10 to the data center network, even during its physical migration.

Figure 5:
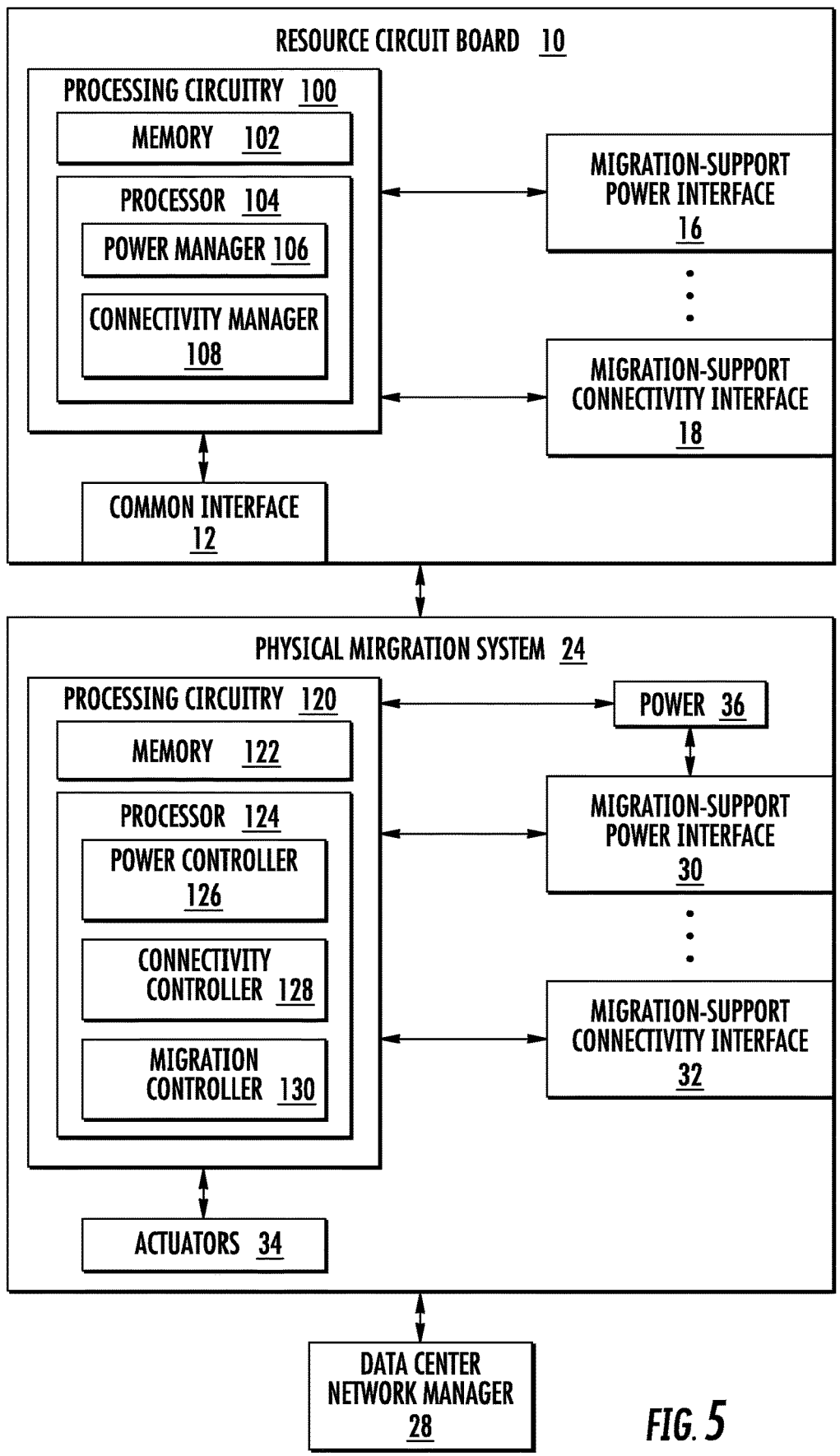
FIG. 5 is an exemplary network diagram with the resource circuit board in communication with a physical migration system and a data center network manager, according to one embodiment of the present disclosure.

Referring now primarily to FIG. 5, an exemplary data center network is shown with at least one resource circuit board 10, the physical migration system 24 for physically migrating resource circuit boards 10 according to the principles of the present disclosure, and a network manager/controller 28 for controlling connectivity of the resource circuit boards 10 to the data center.

In one embodiment, the physical migration system 24 may include corresponding migration-support interfaces that are shaped and configured to connect with the migration-support interfaces 16, 18 of the resource circuit board 10. In one embodiment, the physical migration system 24 may include a corresponding migration-support power interface 30 and a corresponding migration-support connectivity interface 32. These corresponding migration-support interfaces 30, 32 associated with the physical migration system may be configured to provide at least one of power and connectivity to the resource circuit board 10 during the physical migration of the resource board 10 by the physical migration system 24, or more particularly, at least a portion of the physical migration system 24, such as, for example, a movement member 26 (e.g., a robotic member, a machine-controlled track system, etc.). In one embodiment, at least a portion of the physical migration system 24 may include actuators 34 (e.g., motors) configured to mechanically move/translate/rotate/etc., so as to move/translate/rotate, connect, disconnect, etc. the resource circuit board 10 for physical migration.

In one embodiment, the migration-support power interface 30 of the physical migration system 24 may be configured to connect to the migration-support power interface 16 before starting the removal of the resource circuit board 10 from a first location (e.g., the original hosting chassis) at the start of a hot and/or live physical migration. Once connected, the migration-support power interfaces 16, 30 provide the required power and also modification/response to the power needs of the resource circuit board 16 as it is moved to the target location (e.g., destination host chassis). In one embodiment, the physical migration system 24 may include a power source 36 or may be otherwise connected to a power source for supplying power to the resource circuit board 10 during migration. Other configurations for supplying power to the resource circuit board 10 during migration may be used in embodiments of the present disclosure than that shown in FIG. 5, which is merely an exemplary configuration. For example, in another embodiment, the resource circuit board 10 may include an on-board battery that is only accessed and used during migration. Yet other configurations and techniques may be used in embodiments in order to provide the hot migration of the resource circuit board 10.

In one embodiment, the resource circuit board 10 may include the migration-support power interface 16 on a side/face of the resource board 10 that is different from the side/face of the resource board 10 on which the common interface 12 is disposed, so as to accommodate a dual connection of both the common interface 12 and simultaneously the migration-support interfaces 16, 18 at the start and end of the migration, during the interface switching procedures.

In one embodiment, the migration-support connectivity interface 32 of the physical migration system 24 may be configured to connect to the corresponding migration-support connectivity interface 18 on the resource circuit board 10 for providing connectivity during physical migration. Similar to the migration-support power interfaces, the resource circuit board 10 may include the migration-support connectivity interface 18 on a side/face of the resource board 10 that is different from the side/face of the resource board 10 on which the common interface 12 is disposed. In some embodiments, the resource circuit board 10 may not include or may not use the migration-support connectivity interfaces, 18, 32 in, for example, cases where the workflow does not require the resources on the resource circuit board 10 to perform any interaction with other resources (on, for example, other resource boards at the data center) during the physical migration. Even in such embodiments where connectivity is not required in the workflow, the resource circuit board 10 may be configured to preserve its 'state' during the physical migration so that once it is connected to the destination base circuit board 22, the resource circuit board 10 may continue its operations. Thus, in some embodiments, a hot migration would allow the resource circuit board 10 to preserve its state during the migration in, for example, volatile memory buffers. Preferred embodiments of the present disclosure include both power and connectivity migration-support interfaces 16, 18, 30, 32 to enable both live and hot physical migration of the resource boards 10.

In one embodiment, the connectivity may be enabled by the "common" connectivity components of the data center design (such as, for example, top of rack/cabinet switches). Additional on-purpose connectivity components could be included in some embodiments of the resource board 10 in order to keep the resource board 10 connected to network during its physical migration. Such extra connectivity may be mapped to the "common" connectivity fabric of the data center in order to make the connect/disconnect steps of physical migration transparent to the resource board 10 and the overall workflow. For example, in some data centers, a top-of-cell switch may be used to handle to connectivity between the physical migration system 24 (e.g., mechanical arm/robot) and the backplane of individual cabinets involved.

In one embodiment, the migration-support interfaces 30, 32 may be disposed on the movement member 26 of the physical migration system 24, such as, the robotic arm. The migration-support interfaces 30, 32 of the physical migration system 24 may in some embodiments be shaped and configured as mating connectors to the migration-support interfaces 16, 18 of the resource circuit board 10. The migration-support interfaces 30, 32 and 16, 18 may be physically, logically, electrically, and/or optically configured to connect to one another so as to implement the techniques described herein. In one embodiment, the migration-support interfaces 16, 18, 30, 32 may be configured with wired mechanical connections. In other embodiments, some of the migration-support interfaces 16, 18, 30, 30, 32 may be configured as a wireless interface. For example, the migration-support connectivity interfaces 18, 32 may be configured as wireless interfaces. The performance of a wireless link along a migration path (considering mechanical movements and obstructions) may be considered in the design of such interfaces and may, in some embodiments, be set to an off state when not in migrating mode, in order to not interfere with other wireless interface signals in the "common" design of the infrastructure.

It should be understood that although FIG. 5 shows a connection arrow between the exemplary resource board 10 and the physical migration system 24, the connection between the resource board 10 and the physical migration system 24 can be between the migration-support interfaces 16, 18, of the resource board 10 and the corresponding migration-support interfaces 30, 32 of the physical migration system 24, as discussed herein.

In addition, although the present disclosure describes at least three types of migration-support interfaces (power, connectivity, and identification), other embodiments may include additional migration-support interfaces to further support physical live and/or hot migration of the resource circuit boards 10. For example, further embodiments of the resource circuit board 10 may also include liquid and/or air flow cooling interfaces to support cooling during physical migration.

As discussed herein above, the resource circuit board 10 may include at least one migration-support interface 16, 18 that is different from the common interface 12. The migration-support interface 16, 18 may be shaped to connect to the corresponding migration-support interface 30, 32 associated with the physical migration system 24. The resource circuit board 10 may also include one or more physical resources (not shown), such as, for example, memory, storage, network, and compute resources. In some embodiments, such resources may be configured and arranged to support a tenant system, while the migration-support interfaces 16, 18 (and associated components) are configured primarily to access these resources and support functionality of the resource board 10 in transit, during physical migration (when the resource circuit board is disconnected from the interconnect 20 of the base circuit board 22).

In one embodiment, the resource circuit board 10 and/or the physical migration system 24 may include processing circuitry or other components to support the functionality of the migration-support interfaces. For example, in some embodiments, the resource circuit board 10 may include processing circuitry 100. In some embodiments, the processing circuitry 100 may include a memory 102 and a processor 104, the memory 102 including instructions that, when executed by the processor 104, configures the processor 104 to perform the one or more functions described herein. The processor 104 and/or the processing circuitry 100 may be any kind of data processor and may include, for example, a central processing unit, a microcontroller, a microprocessing device, integrated circuitry for processing and/or control, such as, one or more processors and/or processor cores and/or FPGAs (Field Programmable Gate Array) and/or ASICs (Application Specific Integrated Circuitry), etc. The memory 102 may include any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). The memory 102 may store instructions that, when executed by the processor 104, configure the processor 104 to perform one or more of the techniques described herein.

In one embodiment, the resource board 10 may include a power manager 106 and a connectivity manager 108. The power manager 106 may be implemented in the processor 104, otherwise in the processing circuitry 100, or in another component of the resource board 10. The power manager 106 may be configured to switch a power supply to the resource circuit board 10 from a common power supply (for normal use of the resources thereon) to a migration-support power supply (e.g., 36). The migration-support power supply may supply power to the resource circuit board 10 via the migration-support power interface 16 (which may be considered a power connection) and the common power supply may supply power to the resource circuit board 10 via another power connection. In one embodiment, the common interface 12, when connected to the interconnect 20 on the base circuit board 22, may supply power to the resource circuit board 10 through one or more power lines. However, when the resource circuit board 10 is disconnected from the base circuit board 22, power may be supplied by the physical migration system 24 to support hot physical migration. The power manager 106 may further be configured to switch the power supply back to the common power supply once the resource circuit board 10 has been migrated to the target/destination location (e.g., chassis) and the common interface 12 is again connected to the interconnect 20 and base circuit board 22 at the destination location.

In a preferred embodiment, in order to ensure a continuous (or at least substantially continuous) supply of power to the resource circuit board 10 during physical migration, including the switching stages between power supplies, a "make-before-break" of power may be performed, before switching from one power supply (e.g., the common power supply) to another power supply (e.g., the migration-support power supply), and vice versa. In other embodiments, a battery backup system may be configured to provide the continuity of power for the hot physical migration.

In one embodiment, the resource circuit board 10 may include a connectivity manager 108. Like the power manager 106, the connectivity manager 108 may be implemented in the processor 104, otherwise in the processing circuitry 100, or in another component of the resource board 10. The connectivity manager 108 may be configured to manage the process of switching connectivity from the common interface 12 to the migration-support interface 18. In one embodiment, the connectivity manager 108 may be configured to detect a connection of the migration-support interface 18 of the resource board 10 to the corresponding migration-support interface 32 of the physical migration system 24. In one embodiment, the connectivity manager 108 may be configured to, as a result of detecting such connection, switch connectivity from the common interface 12 to the migration-support interface 18. In some embodiments, switching connectivity from the common interface 12 to the migration-support interface 18 includes changing connectivity addresses (e.g., Internet Protocol (IP) address, Media Access Control (MAC) address, etc.) and/or ports from those associated with the common interface 12 to connectivity addresses and/or ports of the migration-support interface 18. Doing so may allow the data center network manager/controller 28 to send data to the correct addresses and ports during migration. In one embodiment, switching connectivity from the common interface 12 to the migration-support interface 18 may include terminating the communication of data to the common interface 12 and instead, begin communicating data to the migration-support interface 18. As will be described in more detail below, in some embodiments, switching connectivity from the common interface 12 to the migration-support interface 18 may include the resource board 10 participating in a handshake protocol with the data center network manager 28 in order to switch the connectivity. In a further embodiment, participation in the handshake protocol may include clearing one or more buffers associated with the common interface 12 and after verifying that the buffers are clear, disabling the common interface 12. Content in the buffers may be stored temporarily in memory, such as the memory 102, and may be handled by the connectivity manager 108 to avoid data errors. The connectivity manager 108 may further be configured to switch connectivity back to the addresses and/or ports associated with the common interface 12 once the resource circuit board 10 has been migrated to the target/destination location (e.g., chassis) and the common interface 12 is again connected to the interconnect 20 and base circuit board 22 at the destination location.

As with the resource circuit board 10, the physical migration system 24 may include processing circuitry or other components to support the functionality of the migration-support interfaces. For example, in some embodiments, physical migration system 24 may include processing circuitry 120. In some embodiments, the processing circuitry 120 may include a memory 122 and a processor 124, the memory 122 including instructions that, when executed by the processor 124, configures the processor 124 to perform the one or more functions described herein. The processor 124 and/or the processing circuitry 120 may be any kind of data processor and may include, for example, a central processing unit, a microcontroller, a microprocessing device, integrated circuitry for processing and/or control, such as, one or more processors and/or processor cores and/or FPGAs (Field Programmable Gate Array) and/or ASICs (Application Specific Integrated Circuitry), etc. The memory 122 may include any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). The memory 122 may store instructions that, when executed by the processor 124, configure the processor 124 to perform one or more of the techniques described herein.

In one embodiment, the physical migration system 24 may include a power controller 126, a connectivity controller 128, and a migration controller 130. The power controller 126 of the physical migration system 24 may be configured to control the power supply through the migration-support power interface 30 to support a hot physical migration of a connected resource circuit board 10. The connectivity controller 128 may be configured to support switching connectivity from the common interface 12 to the migration-support connectivity interfaces 18, 32 to enable the live physical migration of the resource circuit board 10. The migration controller 130 may be configured to control and manage the physical migration of resource boards 10 within the data center. In one embodiment, the migration controller 130 may be configured to command actuators 34 to physically move/migrate the movement member 26, which migration may include, for example, moving the movement member 26 to a first location with a resource board 10 scheduled for migration, connect to the resource board 10, disconnect the resource board 10 from the base circuit board 22 at the first location, move the resource board 10 to the target location, connect the resource board 10 to the base circuit board 22 at the target location, and disconnect the resource board 10 from the physical migration system 24.

In one embodiment, the data center network manager 28 may be considered a central network controller that manages, controls, routes, etc. connections and communications for the resources in racks, cabinets, and chassis at the data center.

Figure 6:
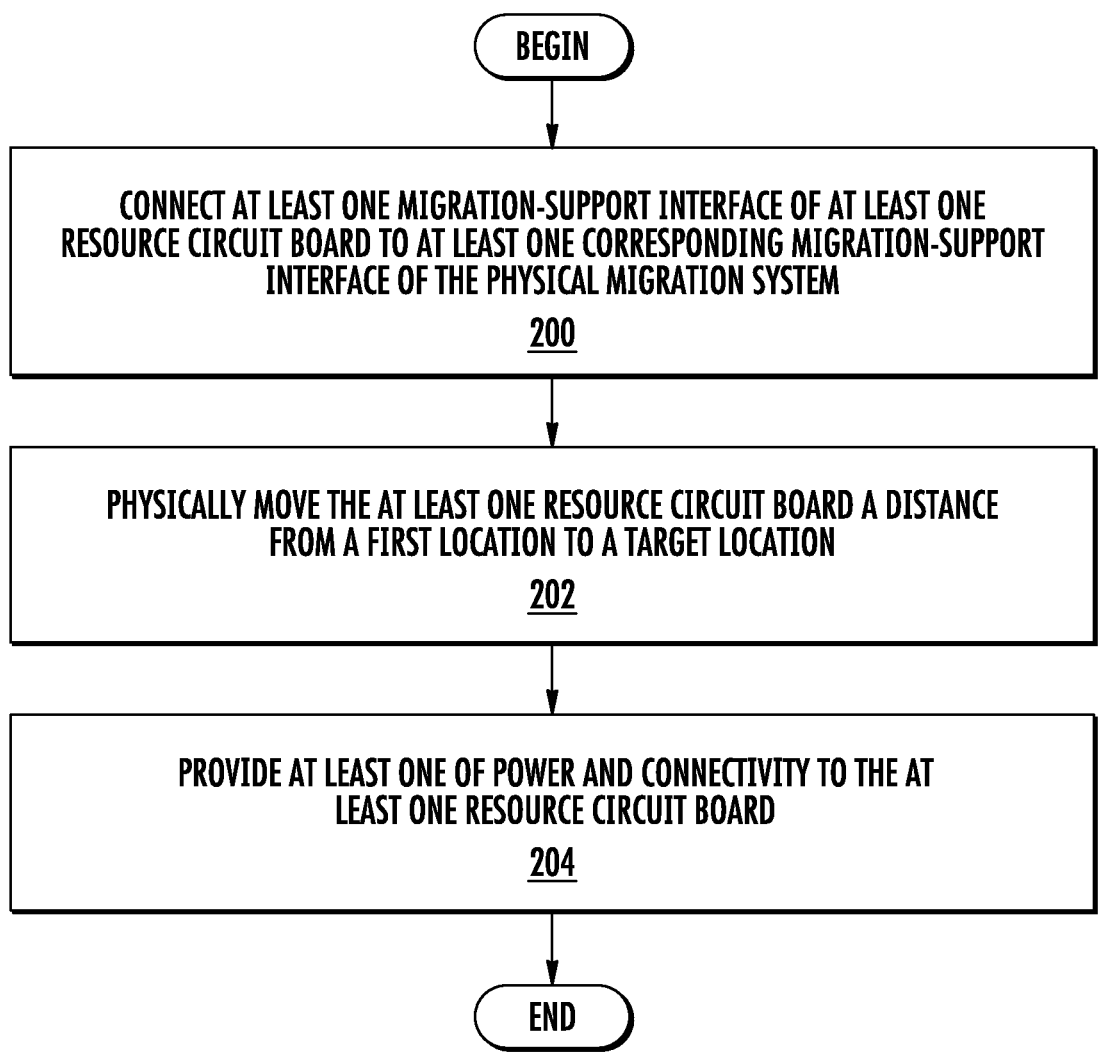
FIG. 6 is a flowchart of an exemplary method of migrating a resource circuit board from a first location to a second location, according to the principles of the present disclosure.

Referring now primarily to the flow chart in FIG. 6, one exemplary method is shown for physically migrating the resource circuit board 10 according to the principles of the present disclosure. In one embodiment, the one or more migration support interfaces 16, 18 of the resource circuit board 10 may be connected to one or more corresponding migration support interfaces 30, 32 of the physical migration system 24 (block S200). The resource circuit board 10 may be physically moved/migrated a distance from a first location to a target location (block S202). At least one of power and connectivity may be provided to the resource circuit board 10 during at least a portion of the physical movement/migration (block S204).

Figure 7A:
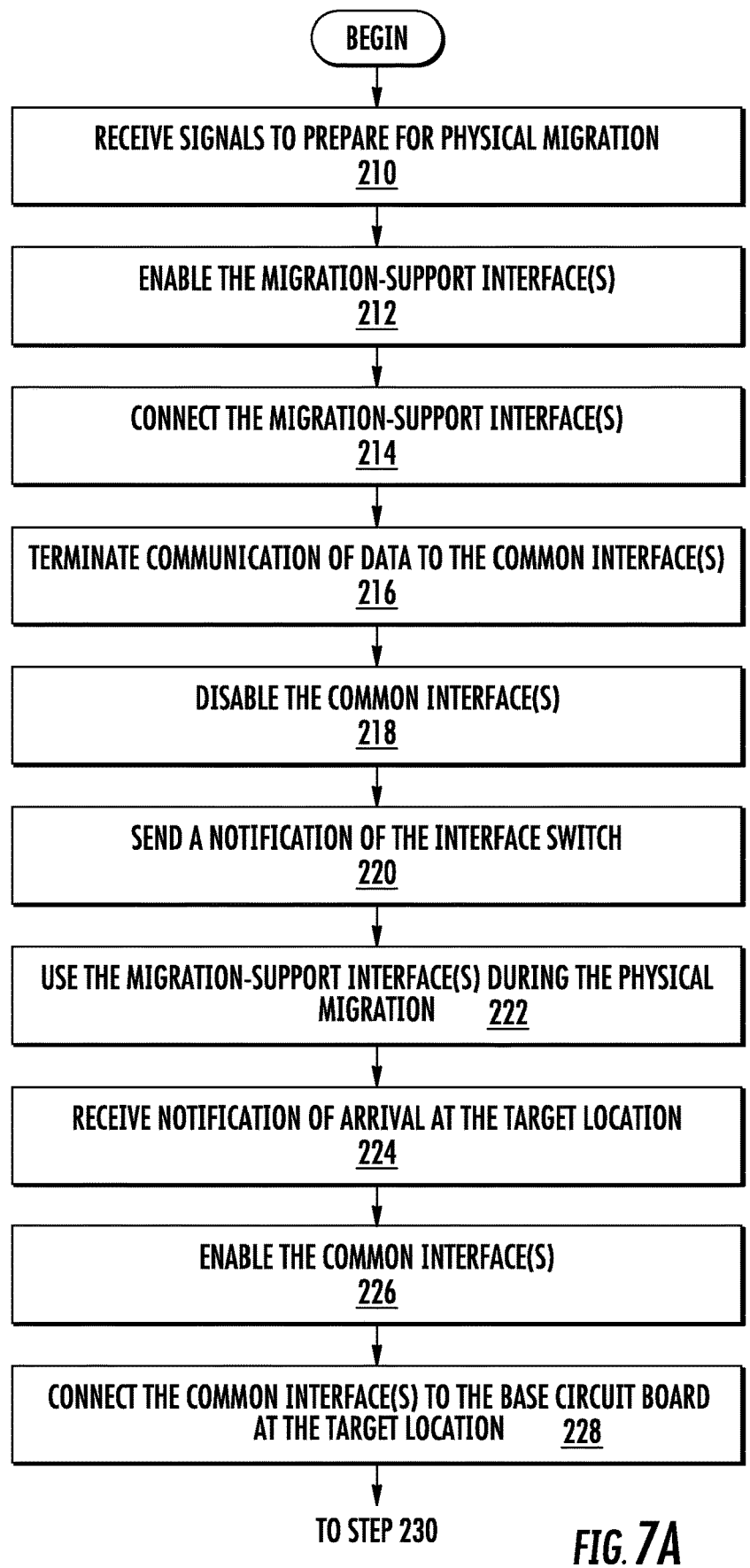
FIGS. 7a-7b illustrate a flowchart of yet another exemplary method of physically migrating at least one resource circuit board according to the principles of the present disclosure.
Figure 7B:
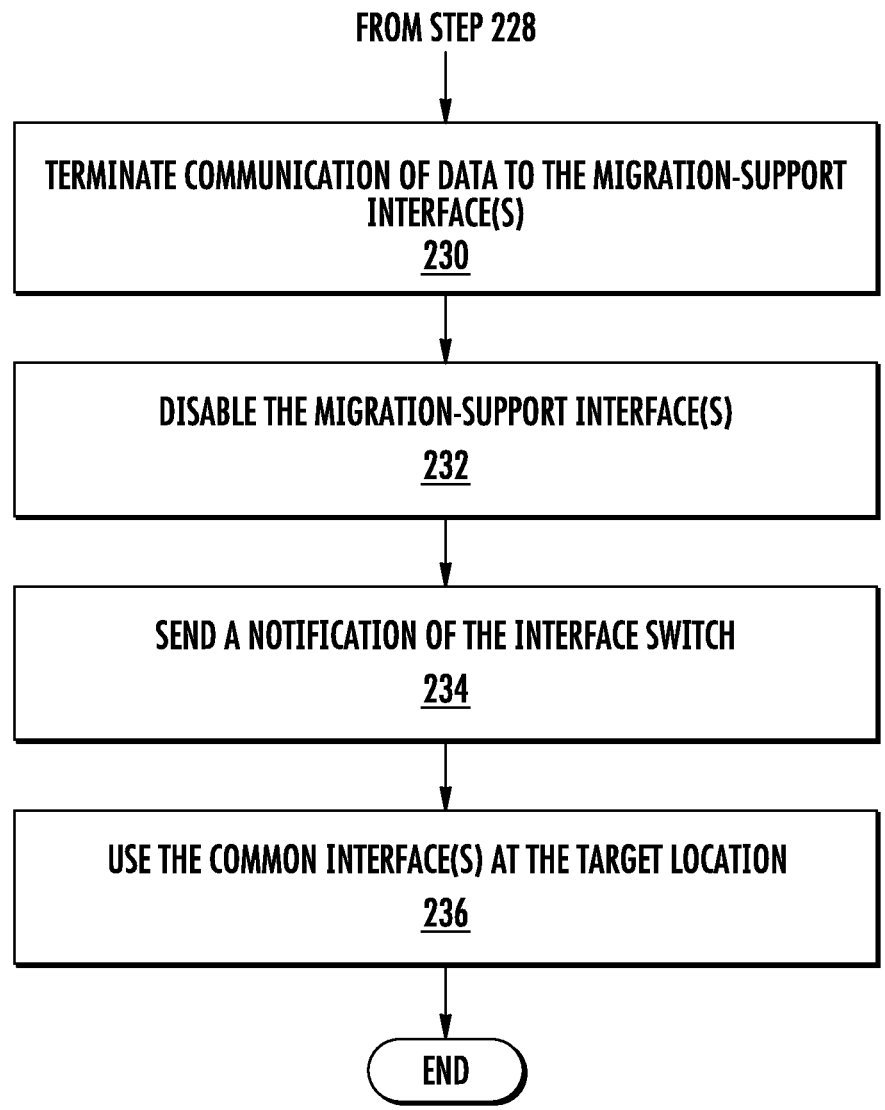
Figure 8:
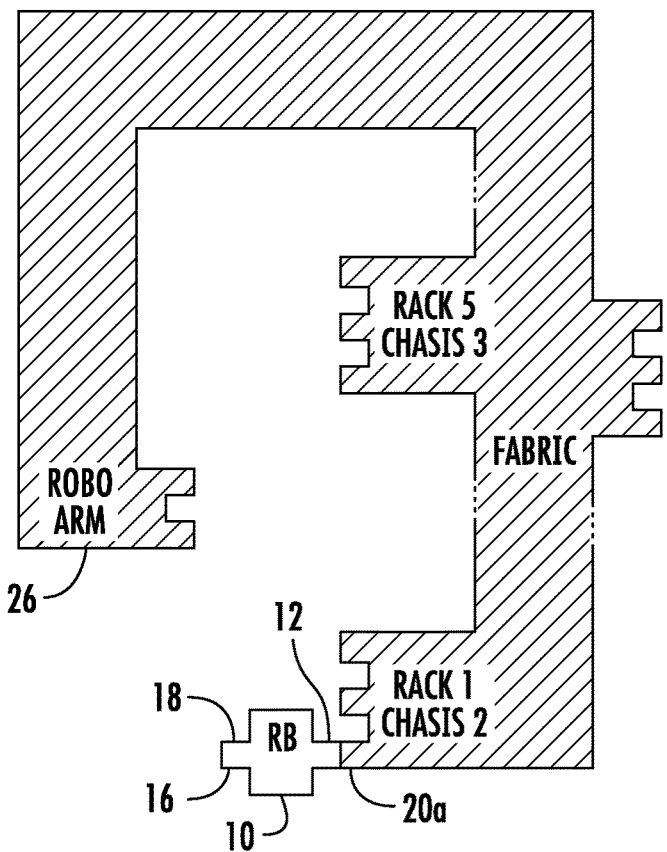
FIG. 8 illustrates an exemplary physical migration of a resource circuit board in a pre-migration stage at a first location, according to the principles of the present disclosure.
Figure 9:
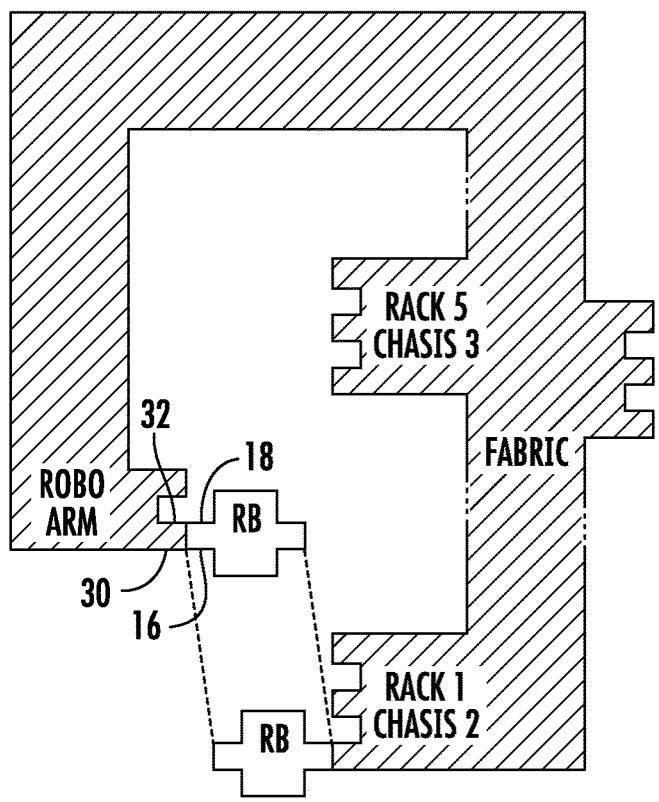
FIG. 9 illustrates the physical migration of the resource circuit board of FIG. 8 in a migration stage, showing a transfer of the resource circuit board to the robotic member, according to the principles of the present disclosure.
Figure 10:
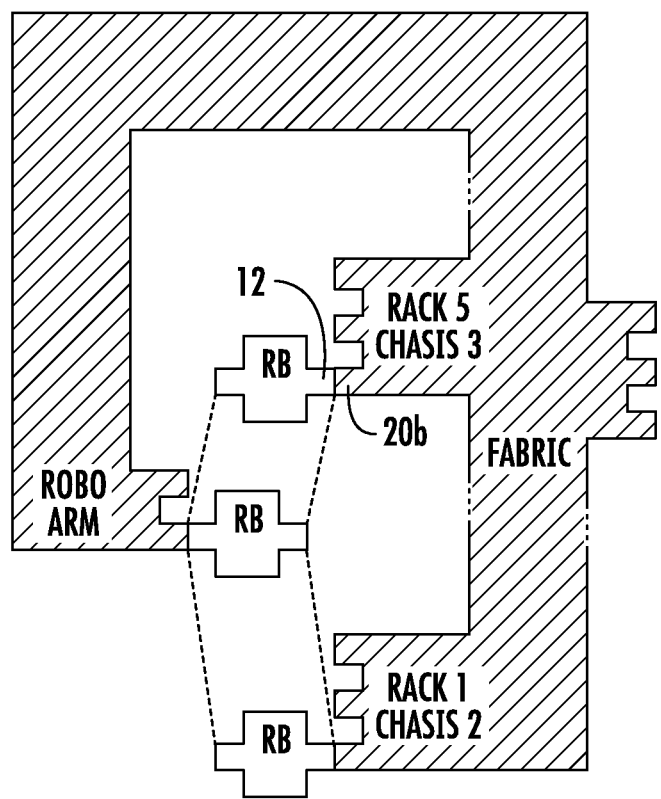
FIG. 10 illustrates the physical migration of the resource circuit board of FIG. 8 in a post-migration stage, transferred to a second, target location, according to the principles of the present disclosure.

Referring primarily to the flow chart of FIGS. 7A and 7B, with reference also to FIGS. 8-11, another exemplary method is described for physically migrating the resource circuit board 10 according to the principles of the present disclosure. The method may include receiving signals to prepare for physical migration (block S210). In one embodiment, the data center network manager 28, or a manager for the physical migration system 24 may send a signal to the targeted resource circuit board 10 to prepare for physical migration. In this step, the resource board 10 may already be plugged into/connected to the interconnect 20a at the first location, as shown, for example, in FIG. 8. Thus, to prepare for the physical migration from the first location to the target location, the resource circuit board 10 (e.g., the processing circuitry 100) may enable or turn on the migration-support interfaces 16, 18 (block S212). In one embodiment, the migration-support connectivity interface 18 may have a MAC address that is different from the MAC address associated with the common interface 12 so that the migration-support connectivity interface 18 may be uniquely identified to the network, separate from the common interface 12 network connection. The migration-support interfaces 16, 18 may be connected to the corresponding migration-support interfaces 30, 32 of the physical migration system 24 (block S214), as shown, for example, in FIG. 9. In this step, the at least one movement member 26 may plug the resource circuit board 10 into its migration-support interfaces 30, 32 to support the hot, live physical migration. In one embodiment, the migration-support connectivity interface 18 may be assigned an IP address that is different from the IP address assigned to the common interface 12. In other embodiments, an IP address is not assigned. Communication of data to the common interface 12 may be terminated (block S216). In one embodiment, the resource circuit board 10 (e.g., the connectivity manager 108) may stop the egress of data via the common interface 12 and, at the same time, the data center network manager 28 may stop the ingress of data to the common interface 12 of the resource board 10, thereby preparing for the interface switch. The common interface 12 may be disabled or turned off (block 218). In one embodiment, the resource circuit board 10 (e.g., the connectivity manager 108) may disable or turn off the common interface 12. In one embodiment, the resource board 10 may disable the common interface 12 after a predetermined grace period, or check signal from the common interface 12 that it does not have any data in its buffers. A notification may then be sent to the data center network manager 28 (e.g., management and orchestration (MANO) signals) or the physical migration system 24 that the common interface 12 is disabled and the migration-support interface(s) 16, 18 are connected (block 220). Thus, a hot and/or live physical migration is enabled. The physical migration system 24 (e.g., robotic member) may physically move the resource board 10 toward the target location, as shown, for example in FIGS. 9 and 10. During such physical migration, the resource board 10 may use the migration-support interface(s) 16, 18 to send and receive data and power during the physical migration (block S222). The distance traveled between the first location and the target location may be any distance and the travel time between the locations can be any time.

When the resource board 10 has been migrated to the target location, a notification may be received by the resource board 10 of its arrival at the target location (block S224). In one embodiment, the physical migration system 24 or the data center network manager 28 may send a signal to the resource board 10 (e.g., MANO signals) to inform the board 10 of its arrival at the destination location. Having arrived at the destination location, the resource circuit board 10 may enable or turn on the common interface 12 again (block S226). The common interface 12 may be connected to the interconnect 20 of the destination base circuit board 22 at the target location (block S228). In one embodiment, this may include the physical migration system 24 inserting the resource circuit board 10 into the interconnect 20 of the destination base circuit board 22. In some embodiments, the common interface 12 may be connected with its original IP address and/or MAC address. In other embodiments, the network manager 28 may assign an IP address to the common interface 12 that is different from its original IP address (at the start of the physical migration process). In some embodiments, such as for some Ethernet fabrics, there may not be an IP address involved in the connectivity. Having reconnected the common interface 12 to an interconnect 20 at the destination location, communication of data (and power) to the migration-support interface(s) 16, 18 may be terminated (block S230). In one embodiment, the resource board 10 may stop the egress of data to the migration-support interface(s) 16, 18 and, at the same time, the data center network manager 28 may stop the ingress of data to the migration-support interface(s) 16, 18. The migration-support interface(s) 16, 18 may be disabled (block S232). In one embodiment, after a predetermined grace period, or a check signal from the migration-support interface(s) 16, 18 that it does not have any data in its buffers, the resource board 10 may disable the migration-support interface(s) 16, 18. A notification of the interface switch-back may be sent by the resource board 10 to the network manager 28 and/or the physical migration system 24 (block S234) and the resource board 20 may resume using the common interface 12 at the target location for providing its resources to the tenant systems (block S236). Advantageously, in some embodiments, the processes described herein may be used dynamically by the physical migration system 24, network manager 28, and resource boards 10 to spatially converge resources at the data center for its tenant systems in an automated, flexible, and efficient manner.

Figure 11:
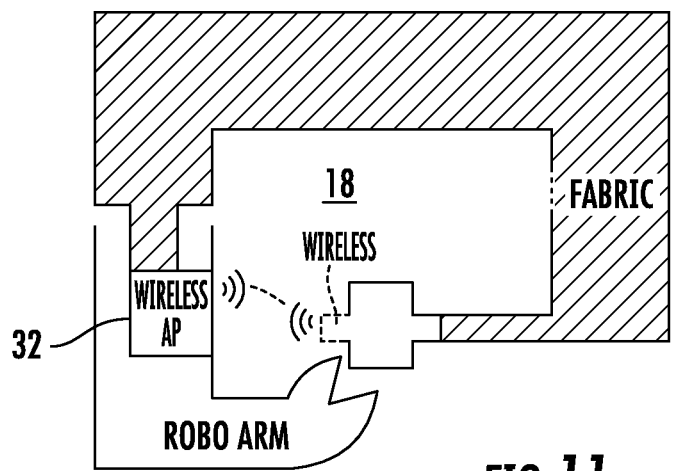
FIG. 11 illustrates an alternative implementation of the robotic member in a wireless interface configuration, according to one embodiment of the present disclosure.

In one embodiment, one or more of the migration-support interface pairs may include a wireless link, in addition to or instead of a physical (e.g., wired) connection. An exemplary embodiment is depicted in FIG. 11, which shows the migration-support connectivity interfaces 18 and 32 as being wireless. In such embodiment, the movement member 26 may still physically contact the resource board 10 to perform the physical migration, however, there would be no data transfer over the physical, mechanical contact, as with, for example, a wired connection. If one of the interface pairs provides a wireless link, some embodiments may be configured to turn off the wireless link when not in migration mode so as to reduce interference with other wireless signals that may be operating at the data center. In other embodiments, all of the migration-support interface pairs may form a wired link, without a wireless aspect.

In some embodiments, when a physical migration is decided by, for example, the physical migration system 24 or the network manager 28, there may be an implicit delay of, for example, a few seconds, for the movement member 26 (e.g., robot arm) to reach the board at its first/initial, departure location. The delay may be used by the resource board 10 to ensure that the buffers associated with the common interface 12 are empty (e.g., grace period) before switching to the migration-support interface(s) 16, 18. Otherwise, in some embodiments, an interval of time delay before a hot and/or live swap (e.g., breaking the primary egress port) may be made in order to wait for memory content to be empty in the case of packet handling.

In one embodiment, the signaling of the port swap to the management/control plane of the data center to coordinate/ synchronize the interface swap may be primarily provided by the data center network manager 28 signaling to the resource board 10. The resource board 10 may relay another signal from its primary/common interface 12 regarding reaching the state of empty buffers to the data center network manager 28. In some embodiments, during the period of time in which both the primary/common interface 12 and the migration-support interfaces 16, 18 are active, the network may behave in a multi-path (multi-interface) routing scenario, and no additional signaling may be required if the data center network manager 28 is configured for multi-path routing. In one embodiment, the data center network manager 28 is configured for multi-path routing to single boards 10. In other words, during the period of time in with both the common interface 12 and one or more of the migration-support interfaces 16, 18 are simultaneously connected to the network, the network manager 28 may be configured to route data through both interfaces, simultaneously.

In one embodiment, the physical migration provides more than a seamless hot swap, but also a live swap because it also allows the resource board 10 to be live and to continue its network operations.

Embodiments of the present disclosure are not limited to any particular network technology and fabric to be used. Any technology and standard ranging from, for example, a PCIe fabric, to Single-Root I/O Virtualization (SR-IOV), to an Ethernet fabric, to Gen-z fabric, to an IEEE-802.3-physical-layer fabric, to NVMe-over Fabric, to optical fiber fabric, and even non-fabric networking, among others, may be compatible with various embodiments of the present disclosure.

Figure 12:
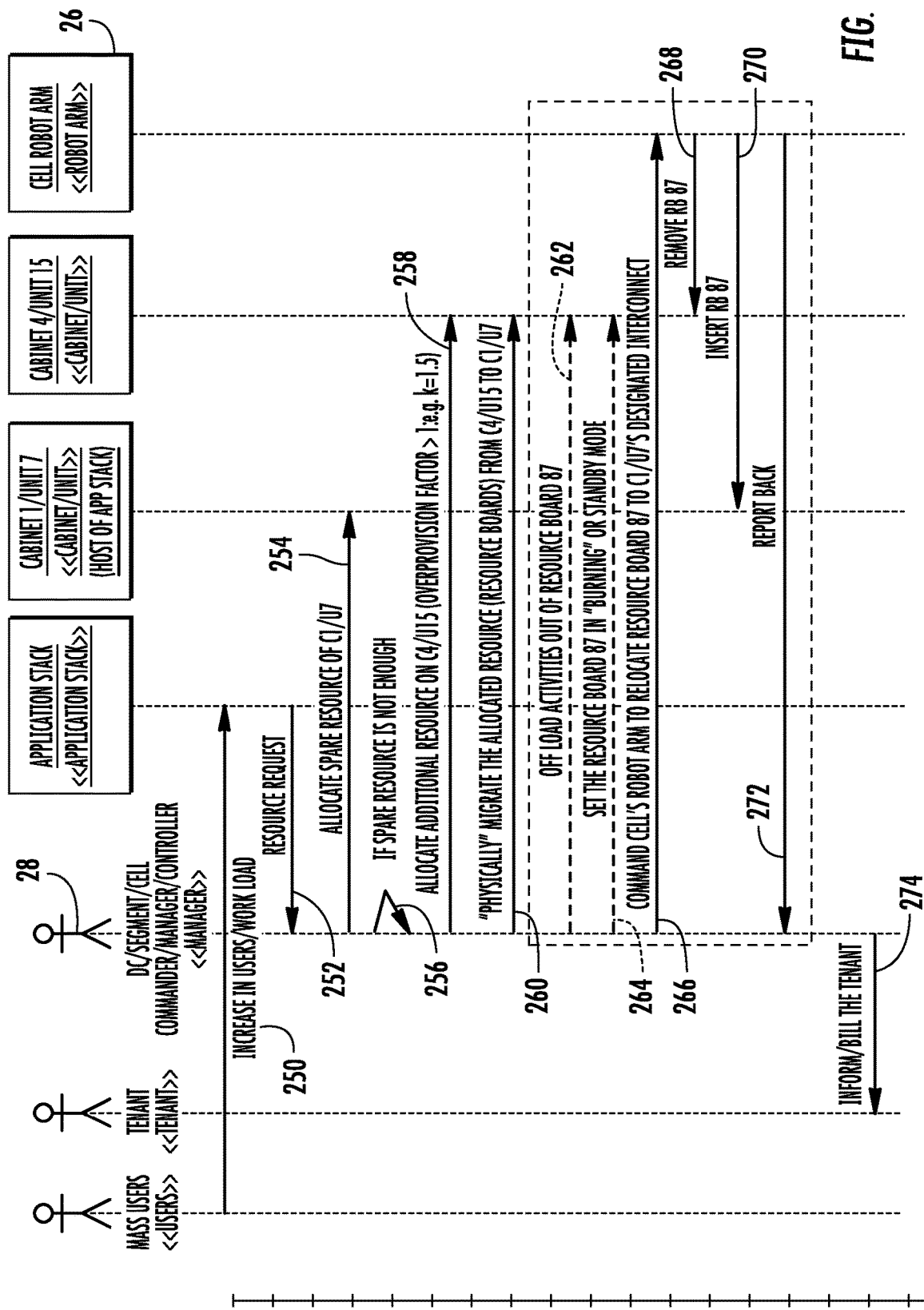
FIG. 12 is a flowchart of an exemplary method of physically migrating at least one resource circuit board according to the principles of the present disclosure.

Referring now to FIG. 12, an exemplary flow chart is shown illustrating another exemplary call flow for physical migration according to one embodiment of the present disclosure. In one embodiment, there may be an increase in users/work load for a particular tenant system (S250). The application stack associated with such tenant system may request additional resources (S252). The network manager 28 may allocate one or more spare resources (e.g., resource board 10) at cabinet 1/unit 7 (S254). In one embodiment, cabinet 1/unit 7 may be assigned to the tenant system requesting additional resources. The network manager 28 may further determine whether the allocation of such spare resources at cabinet 1/unit 7 is sufficient to meet the resource request (S256). If the answer is yes, then no further action may be required. If the answer is no, then the network manager 28 may allocate further resources from another cabinet, such as for example, cabinet 4/unit 15 if an overprovision factor, k, for the cabinet is greater than a predetermined factor, k>1 (e.g., k=1.5) (S258). In other words, the network manager 28 may identify a location (e.g., cabinet) with an overprovision of resources that can be allocated to a location in which there is an underprovision of resources. Having identified a cabinet with an overprovision, the network manager 28 may initiate the physical migration of the allocated resource boards 10 from cabinet 4/unit 15 to cabinet 1/unit 7 (S260). The following steps, S262-272, may be considered an execution of such physical migration. In one embodiment, optionally, the network manager 28 may off load activities out of the resource board 10 scheduled for migration (e.g., RB 87) to another resource (S262) and may set the resource board 10 (e.g., RB 87) to standby or "burning" mode (S264). In a preferred embodiment, the migration-support interfaces 16, 18 may be used (instead of offloading activities) to support the hot and/or live migration discussed herein. The network manager 28 may command the movement member 26 of the physical migration system 24 to relocate RB 87 to cabinet 1/unit 7's designated interconnect 20 (S266). The movement member 26 may remove RB 87 from cabinet 4/unit 15 (S268) and may insert RB 87 into cabinet 1/unit 7 (S270). The physical migration system 24 may report back to the network manager 28 completion of the migration (S272). In one embodiment, the network manager 28 may inform the tenant and provide a bill for the same (S274). Although the description above is described in terms of the network manager 28 managing the allocation of resources, in some embodiments, some or all of the steps may be performed by another entity responsible for such tasks, such as for example, a cell commander or segment controller, etc.

Figure 13:
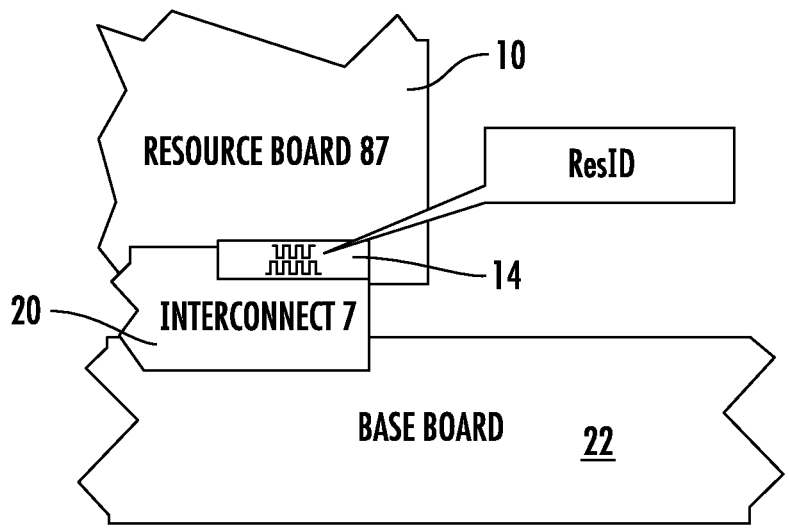
FIG. 13 is a fragmentary, enlarged view illustrating the connectivity of the interconnect, the base circuit board, and the resource circuit board, with a resource identifier, according to the principles of the present disclosure.
Figure 14:
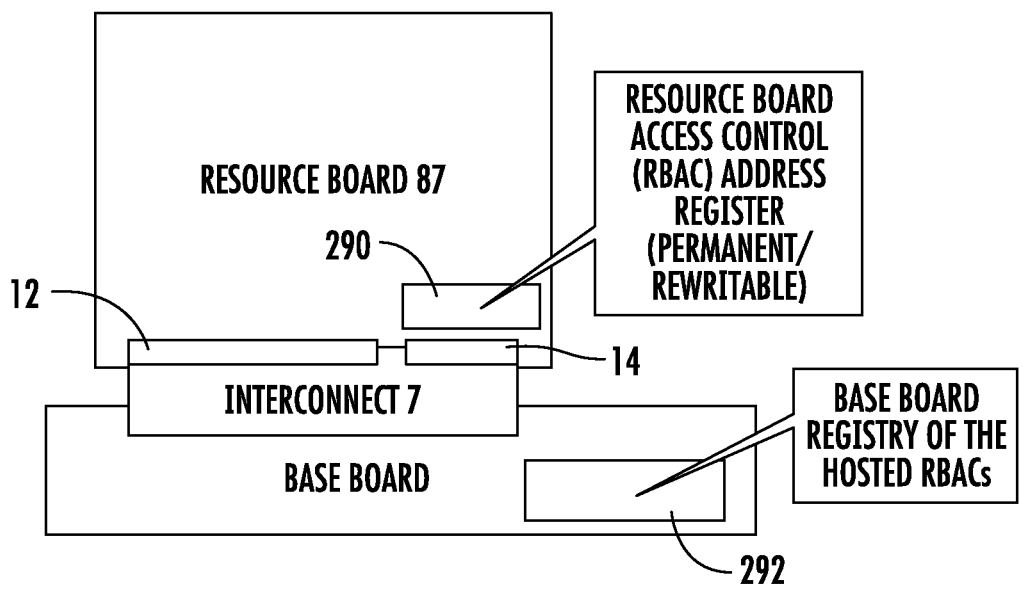
FIG. 14 is a fragmentary, enlarged view illustrating the connectivity of the interconnect, the base circuit board, and the resource circuit board, with a resource board address and registry, according to the principles of the present disclosure.

Referring now primarily to FIGS. 13 and 14, embodiments of the present disclosure may provide for an identification interface 14 that can allow for tracking of resource boards 10. In one embodiment, the resource circuit board 10 may include the identification interface 14. The identification interface 14 may include mechanical, magnetic, or other features to provide a unique physical identifier for the resource circuit board 10. The unique physical identifier may be readable and/or trackable by the base circuit board 22 when the resource circuit board 10 is inserted therein. In one embodiment, the unique identifier may be resiliently coded into the identification interface 14 to deter physical access to the identifiers by unauthorized persons or devices. In some embodiments, the unique physical identifier is configured to survive electronic disaster events that may damage logical identifiers (or the databases associated with tracking of the logical identifiers). Thus, the physical identifiers in the identification interface 14 can be useful for tracing back and for identification purposes.

In one embodiment, as shown in FIGS. 13-14, the identification interface 14 may be disposed on a side of the resource board 10 that the common interface 12 is disposed so that the identification interface 14 can be read by the base circuit board 22, or more particularly, the interconnect 20. A resource board identification (ResID) segment may be on the resource board 10 and may be readable mechanically by the interconnect 20. The ResID may include categorization information, such as, for example, the type of resource board (e.g., compute, memory, storage, WiFi-egress, low power wide area network (LPWAN)-egress, etc.). Such categorization information may be used by, for example, the network manager 28 to allocate resources according to the type of resource requested by the tenant system. In one embodiment, the resource board 10 may also include a resource board access control (RBAC) address register 290. The address register 290 may be, for example, permanent or rewritable memory. In one embodiment, the base circuit board 22 may include a base board registry 292 that may be used to store a record of all the RBACs hosted by the base circuit board 22.

Figure 15:
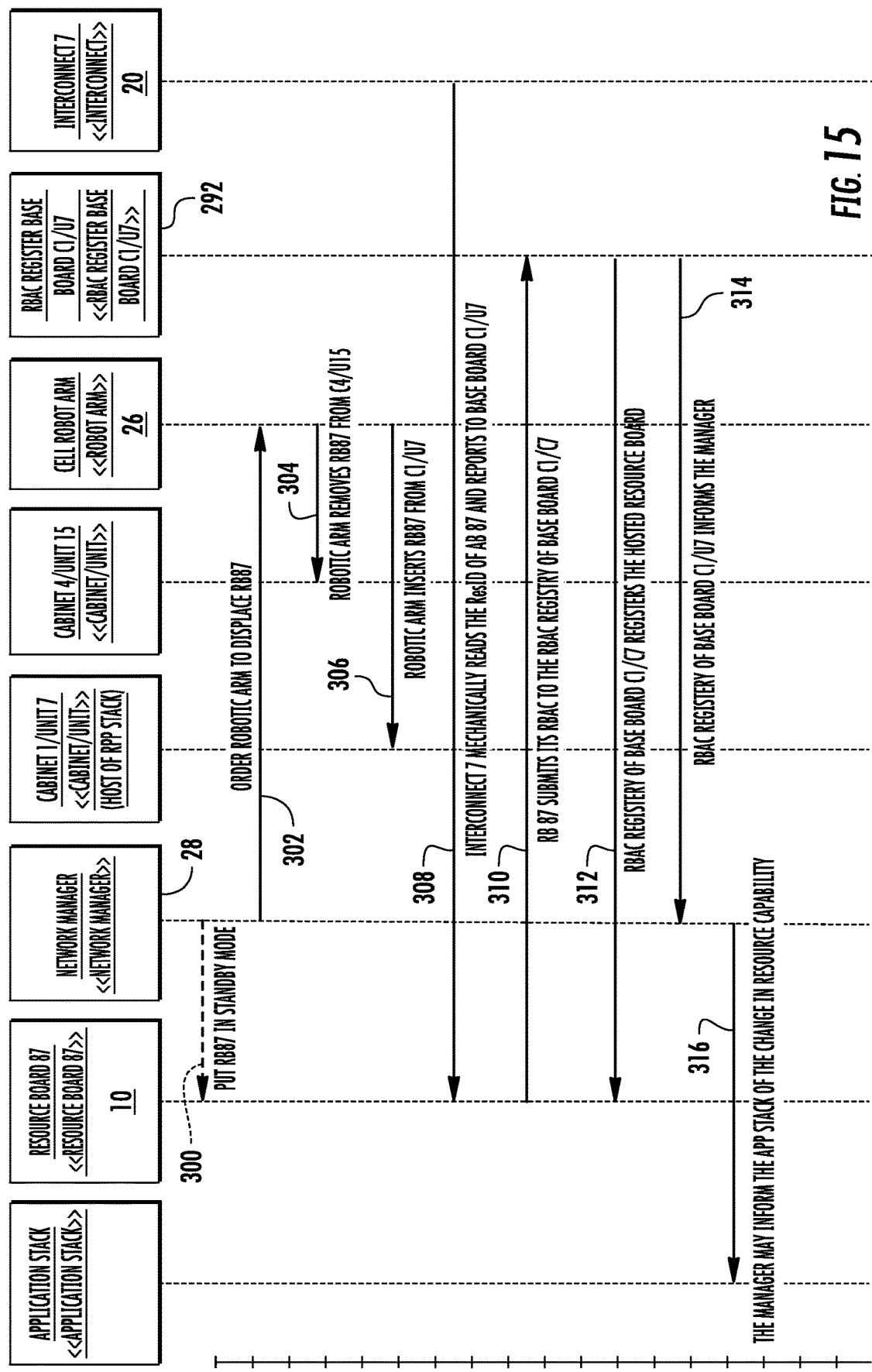
FIG. 15 is a flowchart of an exemplary method of adding a resource circuit board to a compute unit and/or cabinet, according to the principles of the present disclosure.

Referring now primarily to FIG. 15, an exemplary flow chart is shown illustrating another exemplary call flow for adding a new resource board 10 and its associated RBAC address, according to one embodiment of the present disclosure. In one embodiment, the resource board 10 (e.g., RB 87) may optionally be placed in standby mode (S300). In other embodiments, the resource board 10 may be moved using the hot and/or live physical migration process described herein. The network manager 28 may command the movement member 26 to displace the resource board 10 (S302). The movement member 26 may remove the resource board 10 from cabinet 4/unit 15 (S304) and may insert the resource board 10 into cabinet 1/unit 7 (S306). The interconnect 20 may mechanically read the ResID of the resource board 10 and may report it to the base board 22 at cabinet 1/unit 7 (S308). The resource board 10 may submit its RBAC address to the base board registry 292 (S310). The base board registry 292 at cabinet 1/unit 7 may register the hosted resource board 10 (S312). The base board registry 292 may inform the network manager 28 of the registration of the resource board 10 (S314). In one embodiment, the network manager 28 may inform the application stack of the new resource allocation and/or address registry (S316). In one embodiment, such information may be transparent to the top level of the stack; however, even the top level may be rectified of the change in the resource capability. In embodiments, each base board registry 292 has a record of all resource boards 10 that it has hosted and the network manager 28 can track/trace all of its resources. As with the call flow diagram of FIG. 12, although the description associated with the call flow diagram of FIG. 15 is described in terms of the network manager 28 managing the allocation of resources and address tracking, in some embodiments, some or all of the steps may be performed by another entity responsible for such tasks, such as for example, a cell commander or segment controller, etc.

Figure 16:
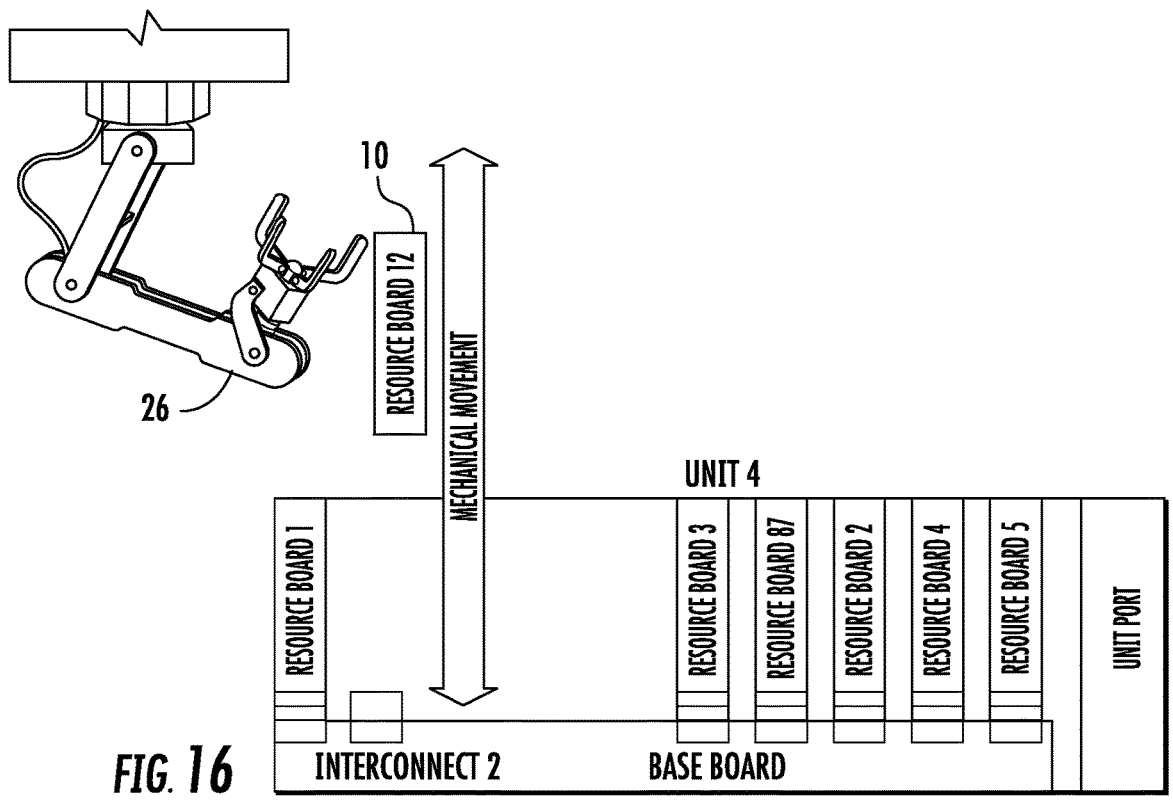
FIG. 16 illustrates an insertion/removal pathway of a resource circuit board into/from the compute unit, according to the principles of the present disclosure.
Figure 17:
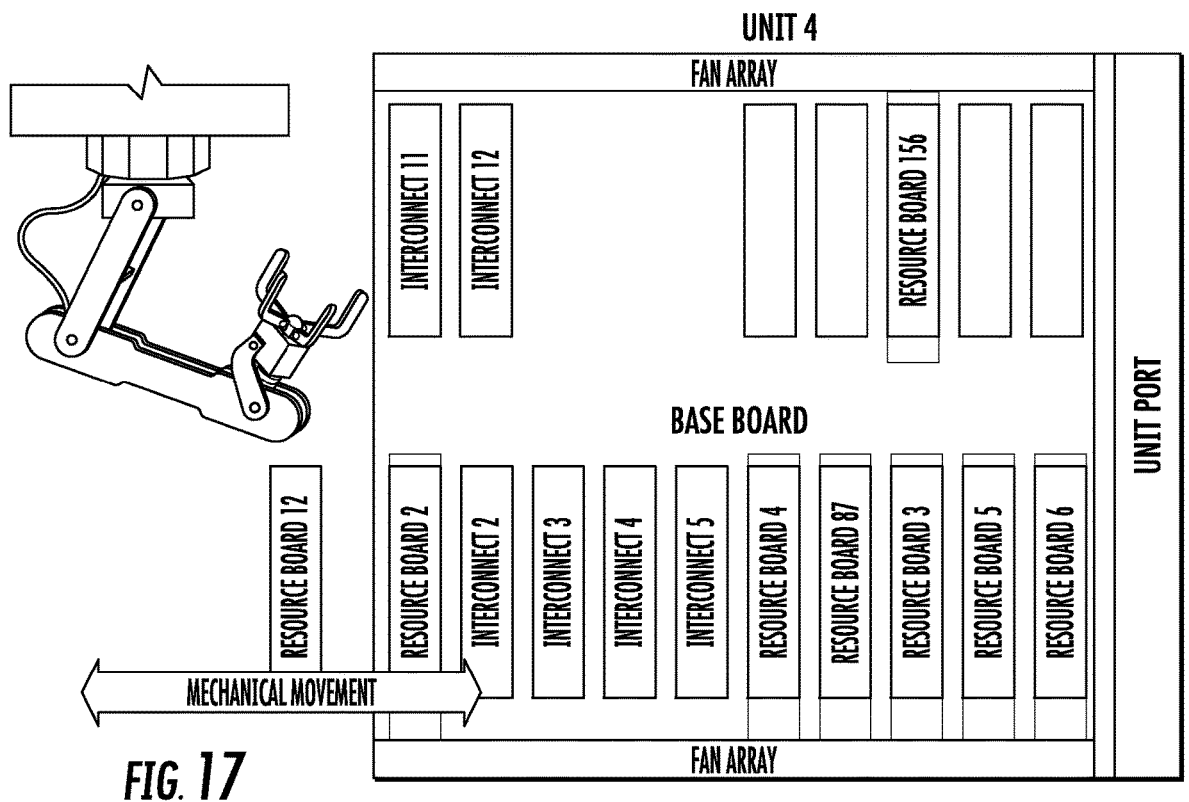
FIG. 17 is a top view of the compute unit of FIG. 16, illustrating the robotic member moving the resource circuit board toward a target interconnect, according to the principles of the present disclosure.

Referring now primarily to FIGS. 16-19, exemplary embodiments of the physical migration system 24 and, in particular, the movement member 26 are shown. FIG. 16 is a side view of a unit, illustrating one embodiment of the insertion/removal of the resource board 10 from the unit. The movement member 26 is shown as a robotic arm. The robotic arm may be disposed in a central area of a radial cell (see FIGS. 20-21). In one embodiment, the robotic arm may carry the resource board 10 to an aligned position on top of the designated interconnect 20 of the target base board 22 of the unit. The alignment may be performed using multiple factors and techniques, such as for example, an absolute position of the robotic arm, light or electromagnetic tickers positioned on the base board 22 along the interconnects 10, among other methods. FIG. 17 illustrates a top view of the unit showing some of the interconnects 20 with resource boards 10 connected thereto and some of the interconnects 20 as empty placeholder slots, waiting to receive resource boards 10.

Figure 18:
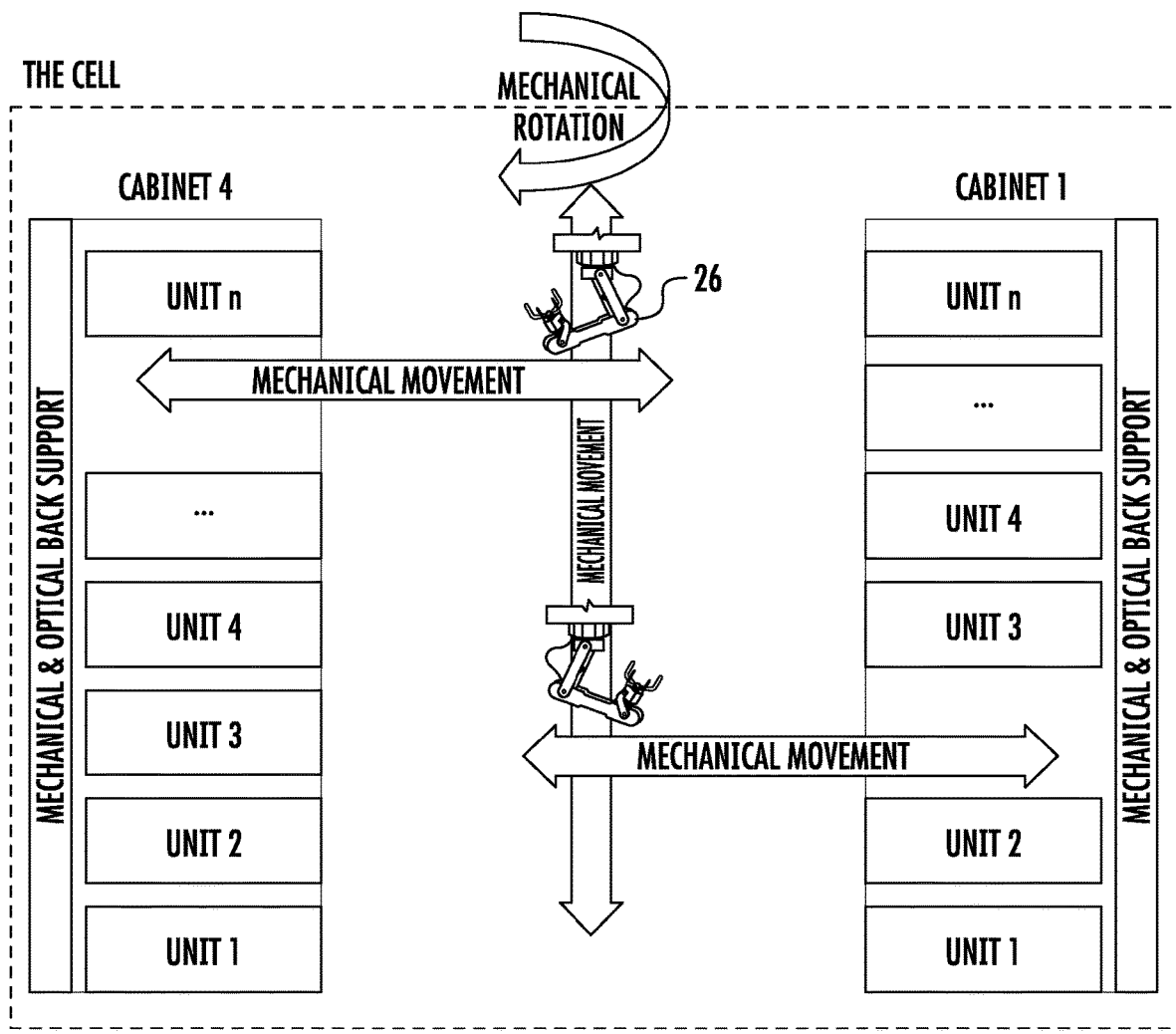
FIG. 18 is an elevational side view of the robotic member within the cell, illustrating a plurality of mechanical movement paths for the robotic member to follow to physically move resource circuit boards between cabinets within the cell, according to the principles of the present disclosure.

FIG. 18 is a side view of a cell, showing the disposition of the robotic arm 26 within the cell and exemplary movement/migration paths for the robotic arm 26 to traverse during migration. As can be seen in FIG. 18, the robotic arm 26 may move along horizontal, vertical, and rotational paths to access each of the units in their respective cabinets.

Figure 19:
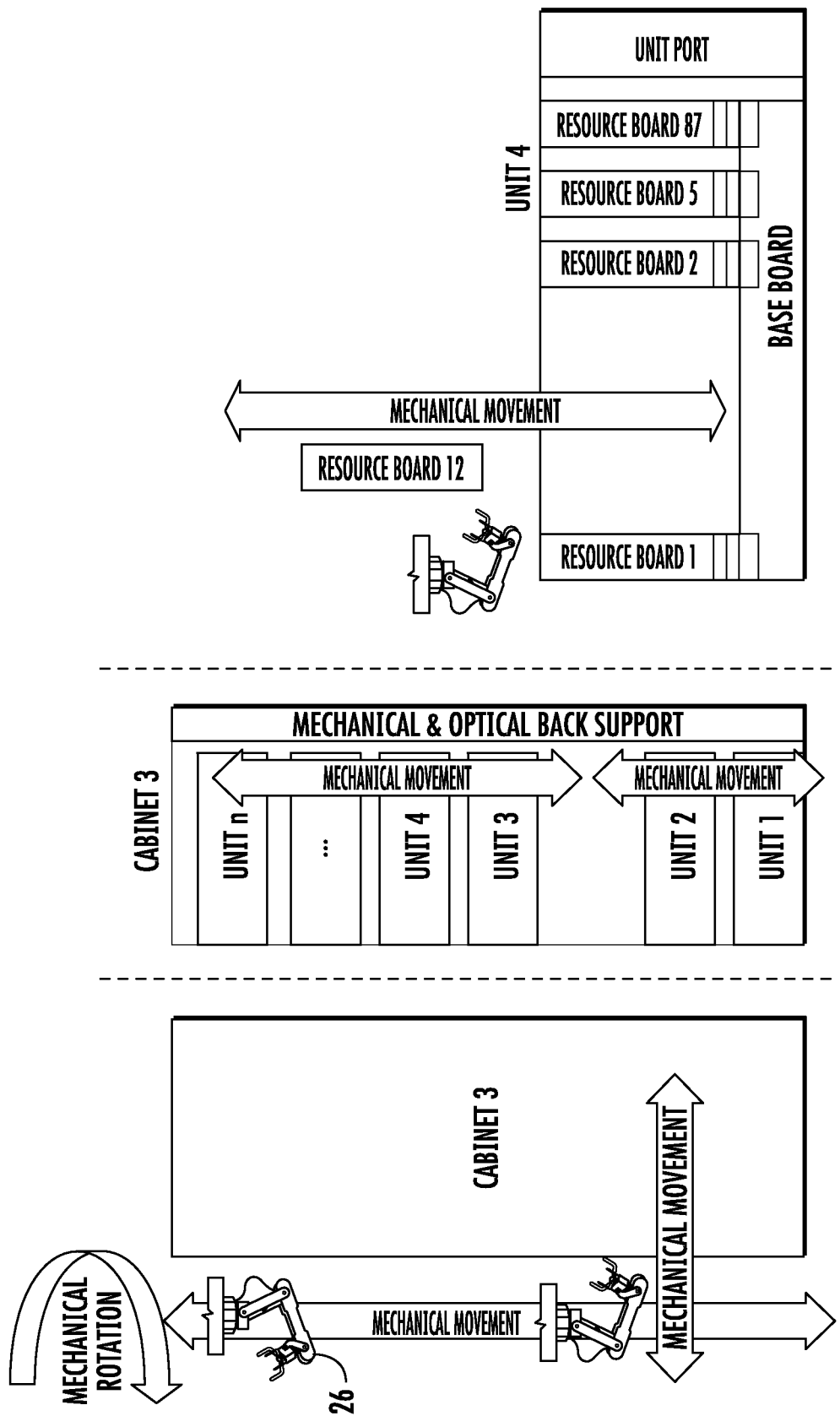
FIG. 19 illustrates an interaction of the robotic member, the cabinets, and compute units at three different granularities, according to the principles of the present disclosure.

FIG. 19 illustrates an exemplary interaction of the robotic arm 26 with the cabinets and units at three different granularities (each granularity separated from another by a dotted line). In the first granularity, the robotic arm 26 is show moving along a vertical and horizontal path adjacent to the cabinet. In the second granularity, another vertical path is shown for the robotic arm 26's movement to access a particular unit within the cabinet. In the third granularity, an exemplary path for the robotic arm 26 to insert the resource board 10 (e.g., RB 12) into the interconnect 20 of the base board 22 is shown.

Figure 20:
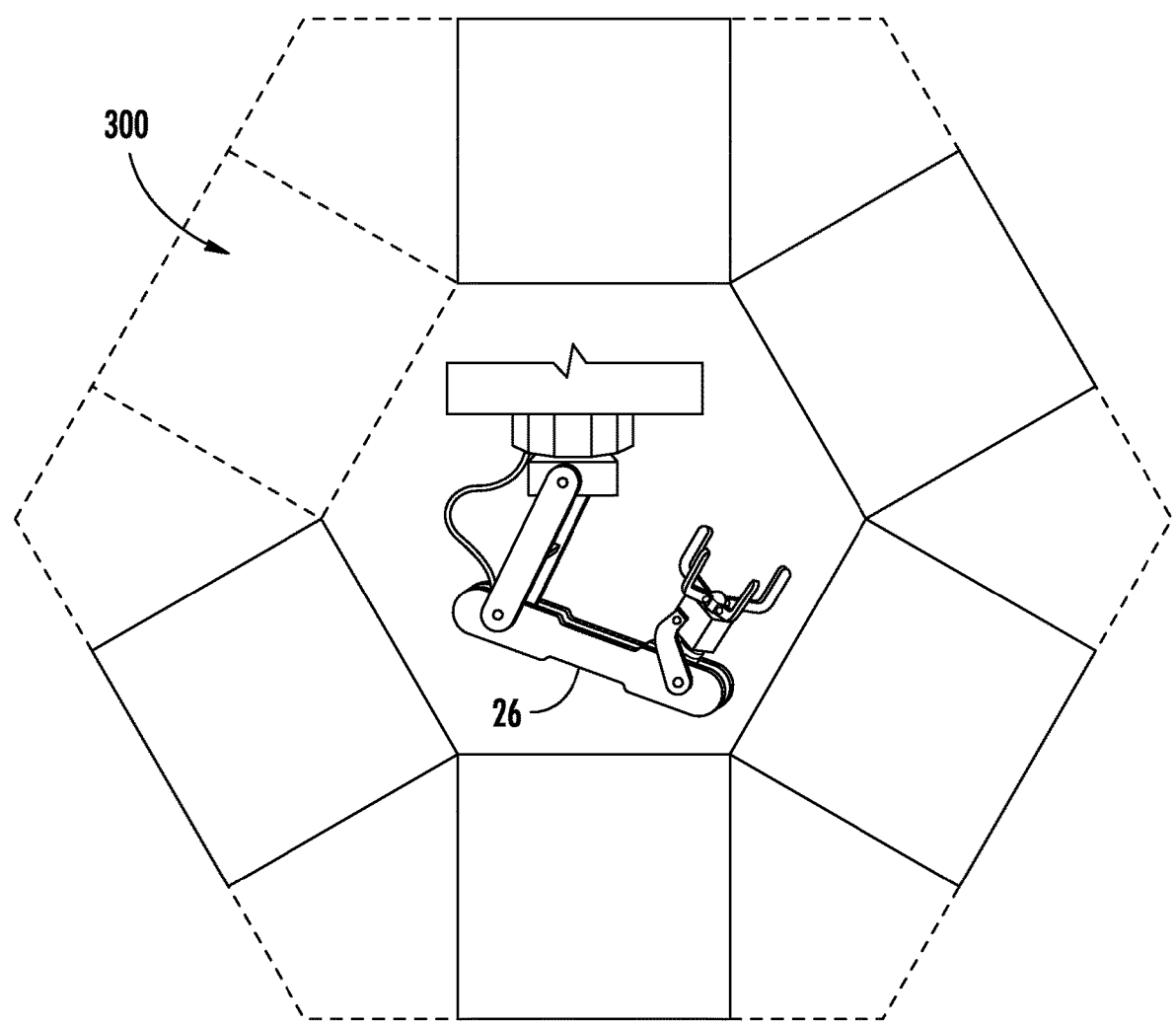
FIG. 20 is a top view of an exemplary radial arrangement of cabinets of a cell around the robotic member, according to one embodiment of the present disclosure.

FIG. 20 illustrates an exemplary cell arrangement. In one embodiment, the cell may be arranged such that the cabinets of the cell form an n-agonal arrangement (e.g., hexagon). The cabinets may be arranged in a radial form (rather than in a linear arrangement) to more efficiently utilize the floor space of the data center and, in some embodiments, provide for adequate access and/or optimal cooling. In one embodiment, the robotic arm 26 may be disposed in a central area, relative to the radial arrangement of the cabinets. Stated another way, in one embodiment, the robotic arm 26 may be disposed radially inward of the cabinets. In one embodiment, the n-agonal arrangement may include a gap/opening 300 between cabinets sized for ease of human access.

FIG. 21 illustrates an exemplary cell with a top-of-cell (ToC) optical interconnect or switch 302. The ToC switch 302 may provide intra-connectivity among all cabinets in the cell, and, in some embodiments, also inter-connectivity with other cells (e.g., PODs). In some embodiments, the cell's robotic arm 26 may also carry the connectivity to the ToC switch 302, where the physical migration of the resource board 10 is performed without discontinuity in the connectivity of the resource board 10, as discussed herein above. In some embodiments, an optical or other wired connection to the network may be included, or carried through the robotic arm 26. Also, in some embodiments in which the robotic arm 26 supplies power to connected resource boards 10, the robotic arm 26 (or other portion of the physical migration system 24) may be connected to or have a power source.

According to a first aspect of the present disclosure, a resource circuit board 10 configured for use by a physical migration system 24 is provided. The resource circuit board 10 includes at least one common interface 12 shaped and configured to connect to an interconnect 20 of a base circuit board 22; and at least one migration-support interface 16 18, the at least one common interface 12 being different from the at least one migration-support interface 16, 18. The at least one migration-support interface 16, 18 is shaped to connect to at least one corresponding migration-support interface 30, 32 of the physical migration system 24; and is configured to provide at least one of power and connectivity to the resource circuit board 10 during a physical migration of the resource circuit board 10.

According to this aspect, in some embodiments, the physical migration system 24 comprises at least one robotic member 26 and the at least one corresponding migration-support interface 30, 32 of the physical migration system 24 is at the at least one robotic member 26. In some embodiments, the at least one migration-support interface 16, 18 is configured to provide the at least one of power and connectivity to the resource circuit board 10 during the physical migration of the resource circuit board 10. In some embodiments, the at least one migration-support interface 16, 18 is configured to provide the at least one of power and connectivity to the resource circuit board 10 only during the physical migration of the resource circuit board 10. In some embodiments, the at least one common interface 12 is arranged at least to support at least one application associated with at least one server utilizing the resource circuit board 10; and the at least one migration-support interface 16, 18 is arranged at least to support the physical migration of the resource circuit board 10. In some embodiments, the at least one migration-support interface 16, 18 is arranged at least to support at least one of a live and a hot physical migration of the resource circuit board 10. In some embodiments, the at least one common interface 12 is shaped and configured to connect to a peripheral component interconnect of the base circuit board 22. In some embodiments, the resource circuit board 10 is configured to switch a power supply to the resource circuit board 10 from a common power supply to a migration-support power supply, the migration-support power supply supplying power to the resource circuit board 10 via the at least one migration-support interface 18 and the common power supply supplying power to the resource circuit board 10 via the at least one common interface 12. In some embodiments, the at least one migration-support interface 16, 18 is disposed on a side of the resource circuit board 10 that is different from a side of the resource circuit board 10 on which the at least one common interface 12 is disposed. In some embodiments, the at least one migration-support interface 16, 18 includes at least one migration-support power interface 16 configured to provide power to the resource circuit board 10 during the physical migration of the resource circuit board 10; and at least one migration-support connectivity interface 18 configured to provide connectivity between the resource circuit board 10 and at least one network connection 302 at a data center during the physical migration of the resource circuit board 10. In some embodiments, the at least one migration-support interface 16, 18 is configured to provide the at least one of power and connectivity to the resource circuit board 10 during the physical migration of the resource circuit board 10 via at least one of a wireless connection and a wired connection. In some embodiments, at least one migration-support interface 16, 18 comprises at least one migration-support identification interface 14 configured with a unique identifier stored in non-transitory memory and readable by the interconnect 20 of the base circuit board 22. In some embodiments, the resource circuit board 10 is a printed circuit board with at least one of at least one memory resource, at least one storage resource, and at least one compute resource arranged at least to support at least one application associated with at least one server utilizing the resource circuit board 10. In some embodiments, the resource circuit board 10 includes processing circuitry 100, the processing circuitry 100 configured to: detect a connection of the at least one migration-support interface 16, 18 of the resource circuit board 10 to the corresponding migration-support interface 30, 32 of the physical migration system 24; and as a result of detecting the connection of the at least one migration-support interface 16, 18 of the resource circuit board 10 to the corresponding migration-support interface 30, 32 of the physical migration system 24, switching connectivity from the at least one common interface 12 to the at least one migration-support interface 16, 18 of the resource circuit board 10. In some embodiments, switching connectivity from the at least one common interface 12 to the at least one migration-support interface 16, 18 comprises at least changing at least one of at least one connectivity address and at least one port of the at least one common interface 12 to at least one of at least one connectivity address and at least one port of the at least one migration-support interface 16, 18 as a result of detecting the connection. In some embodiments, switching connectivity from the at least one common interface 12 to the at least one migration-support interface 16, 18 comprises terminating communication of data to the at least one common interface 12 and instead communicating data to the at least one migration-support interface 16, 18. In some embodiments, switching connectivity from the at least one common interface 12 to the at least one migration-support interface 16, 18 comprises participating in a handshake protocol with at least one data center network manager 28 to switch the connectivity. In some embodiments, participation in the handshake protocol comprises at least clearing at least one buffer associated with the at least one common interface 12 and, after clearing the at least one buffer, disabling the at least one common interface 12. In some embodiments, the processing circuitry 100 is further configured to: detect a connection of the at least one common interface 12 to at least one destination interconnect 20 of a destination base circuit board 22; and as a result of detecting the connection of the of the at least one common interface 12 to the at least one destination interconnect 20 of the destination base circuit board 22: determine whether there is a connection to the migration-support interface 16, 18; and as a result of determining that there is a connection to the migration-support interface 16, 18 and simultaneously a connection to the at least one common interface 12, switch connectivity between the at least one migration-support interface 16, 18 of the resource circuit board 10 and the at least one common interface 12 of the resource circuit board 10.

According to a second aspect, a physical migration system 24 for use at a data center is provided. The physical migration system 24 includes at least one movement member 26 configured to physically migrate at least one resource circuit board 10 from a first location to a second location, the at least one movement member 26 having at least one migration-support interface 30, 32. The at least one migration-support interface 30, 32 is shaped to connect to a corresponding migration-support interface 16, 18 of the at least one resource circuit board 10; and is configured to provide at least one of power and connectivity to the at least one resource circuit board 10 during the at least one movement member's 26 physical migration of the at least one resource circuit board 10. The at least one resource circuit board 10 includes at least one common interface 12 shaped and configured to connect to an interconnect 20 of a base circuit board 22, the at least one common interface 12 being different from the at least one corresponding migration-support interface 16, 18.

According to this aspect, in some embodiments, the at least one movement member 26 includes at least one robotic member 26. In some embodiments, the at least one common interface 12 of the at least one resource circuit board 10 is arranged at least to support at least one application associated with at least one server utilizing the at least resource circuit board 10; and the at least one migration-support interface 16, 18 of the at least one resource circuit board 10 is arranged at least to support the physical migration of the at least one resource circuit board 10. In some embodiments, the physical migration system 24 is configured to physically migrate the at least one resource circuit board 10 within a radial arrangement of cabinets and the at least one movement member 26 is disposed radially inward of the radial arrangement of cabinets. In some embodiments, the at least one migration-support interface 30, 32 of the at least one movement member 26 is arranged at least to support at least one of a live and a hot physical migration of the at least one resource circuit board 10. In some embodiments, the at least one common interface 12 of the at least one resource circuit board 10 is shaped and configured to connect to a peripheral component interconnect of the base circuit board 22. In some embodiments, the at least one resource circuit board 10 is configured to switch a power supply from a common power supply to a migration-support power supply, the migration-support power supply supplying power to the resource circuit board 10 via the at least one migration-support interface 16, 18 and the common power supply supplying power to the resource circuit board 10 via the at least one common interface 12. In some embodiments, the at least one migration-support interface 16, 18 of the at least one resource circuit board 10 is disposed on a side of the at least one resource circuit board 10 that is different from a side of the at least one resource circuit board 10 on which the at least one common interface 12 is disposed. In some embodiments, the at least one migration-support interface 30, 32 of the at least one movement member 26 includes at least one migration-support power interface 30 configured to provide power to the at least one resource circuit board 10 during the at least one movement member's 26 physical migration of the at least one resource circuit board 10; and at least one migration-support connectivity interface 18 configured to provide connectivity between the at least one resource circuit board 10 and at least one network connection 302 at a data center during the at least one movement member's 26 physical migration of the resource circuit board 10. In some embodiments, the at least one migration-support interface 30, 32 of the at least one movement member 26 is configured to provide the at least one of power and connectivity to the at least one resource circuit board 10 during the at least one movement member's 26 physical migration of the resource circuit board 10 via at least one of a wireless connection and a wired connection. In some embodiments, the at least one migration-support interface 16, 18 of the at least one resource circuit board 10 comprises at least one migration-support identification interface 14 configured with a unique identifier stored in non-transitory memory and readable by the interconnect 20 of the base circuit board 22. In some embodiments, the at least one resource circuit board 10 includes at least one printed circuit board with at least one of at least one memory resource, at least one storage resource, and at least one compute resource arranged at least to support at least one application associated with at least one server utilizing the at least one resource circuit board 10. In some embodiments, the at least one migration-support interface 30, 32 of the at least one movement member 26 is configured to provide the at least one of power and connectivity to the resource circuit board 10 only during the at least one movement member's 26 physical migration of the resource circuit board 10. In some embodiments, the physical migration system 24 includes processing circuitry 120, the processing circuitry 120 configured to cause the at least one movement member 26 to: move to a first location at a data center; connect the at least one migration-support interface 30, 32 of the at least one movement member 26 to the corresponding migration-support interface 16, 18 of the at least one resource circuit board 10; move the connected at least one resource circuit board 10 to a target location at the data center; and during the movement of the at least one resource circuit board 10 to the target location, communicate data to the at least one migration-support interface 16, 18 of the at least one resource circuit board 10 instead of communicating data to the at least one common interface 12 of the at least one resource circuit board 10.

According to a third aspect, a method of physically migrating at least one resource circuit board 10 is provided. The method includes connecting at least one migration-support interface 16, 18 of at least one resource circuit board 10 to at least one corresponding migration-support interface 30, 32 of at least one movement member 26; at least a portion of the connected at least one movement member 26 physically moving the at least one resource circuit board 10 a distance from a first location to a target location; and during at least a portion of the physical movement, providing, via the connection of the at least one migration-support interface of at least one resource circuit board 10 to the at least one corresponding migration-support interface 30, 32 of the at least one movement member 26, at least one of power and connectivity to the at least one resource circuit board 10.

According to this aspect, in some embodiments, the method further includes providing the at least one resource circuit board 10 with at least one common interface 12, the at least one common interface 12 being shaped and configured to connect to an interconnect 20 of a base circuit board 22; and after the at least one movement member 26 physically moves the at least one resource circuit board 10 to the target location, connecting the at least one common interface 12 of the at least one resource circuit board 10 to the interconnect 20 of the base circuit board 22 and disconnecting the at least one migration-support interface 16, 18, the at least one common interface 12 being different from the at least one migration-support interface 16, 18. In some embodiments, the at least the portion of the connected at least one movement member 26 physically moving the at least one resource circuit board 10 the distance from the first location to the target location comprises at least one robotic member 26 physically moving the at least one resource circuit board 10 the distance from the first location to the target location. In some embodiments, providing the at least one of power and connectivity to the at least one resource circuit board 10 comprises the at least one robotic member 26 providing the at least one of power and connectivity to the at least one resource circuit board 10 during the at least the portion of the physical movement. In some embodiments, the at least one common interface 12 is arranged at least to support at least one application associated with at least one server utilizing the at least one resource circuit board 10; and each of the at least one migration-support interface 16, 18 of the at least one resource circuit board 10 and the at least one corresponding migration-support interface 30, 32 of the at least one movement member 26 is arranged at least to support the physical migration of the resource circuit board 10. In some embodiments, each of the at least one migration-support interface 16, 18 of the at least one resource circuit board 10 and the at least one corresponding migration-support interface 30, 32 of the at least one movement member 26 is arranged at least to support at least one of a live and a hot physical migration of the resource circuit board 10. In some embodiments, connecting the at least one common interface 12 of the at least one resource circuit board 10 to the interconnect 20 of the base circuit board 22 comprises connecting the at least one common interface 12 of the at least one resource circuit board 10 to a peripheral component interconnect of the base circuit board 22. In some embodiments, the method includes, after connecting the at least one migration-support interface 16, 18 of the at least one resource circuit board 10 to the at least one corresponding migration-support interface 30, 32 of physical migration system 24, switching a power supply for the at least one resource circuit board 10 from a common power supply to a migration-support power supply, the migration-support power supply supplying power to the resource circuit board 10 via the at least one migration-support interface 16, 18. In some embodiments, connecting the at least one migration-support interface 16, 18 of the at least one resource circuit board 10 to the at least one corresponding migration-support interface 30, 32 of the at least one movement member 26 comprises connecting the at least one migration-support interface 16, 18 of the at least one resource circuit board 10 to the at least one corresponding migration-support interface 30, 32 of the at least one movement member 26 at a side of the at least one resource circuit board 10 that is different from a side of the at least one resource circuit board 10 on which the at least one common interface 12 is disposed. In some embodiments, providing the at least one of power and connectivity to the at least one resource circuit board 10 includes: providing power, via at least one migration-support power interface 30, 32, to the at least one resource circuit board 10 during the at least the portion of the physical movement; and providing connectivity, via at least one migration-support connectivity interface 18, between the at least one resource circuit board 10 and at least one network connection 302 at a data center during the at least the portion of the physical movement. In some embodiments, the method further includes, as a result of connecting the at least one migration-support interface 16, 18 of the at least one resource circuit board 10 to the at least one corresponding migration-support interface 30, 32 of the at least one movement member 26, switching connectivity from the at least one common interface 12 to the at least one migration-support interface 16, 18 of the resource circuit board 10. In some embodiments, switching connectivity from the at least one common interface 12 to the at least one migration-support interface 16, 18 comprises using at least one of at least one connectivity address and at least one port of the at least one migration-support interface 16, 18 of the at least one resource circuit board 10 to communicate data, instead of using at least one of at least one connectivity address and at least one port of the at least one common interface of the at least one resource circuit board 10. In some embodiments, switching connectivity from the at least one common interface 12 to the at least one migration-support interface 16, 18 comprises participating in a handshake protocol with at least one data center network manager 28 and the at least one resource circuit board 10 to switch the connectivity.

Some abbreviations used herein may include:

| Abbreviation | Explanation |
| --- | --- |
| HLPM | Hot, Live, Physical Migration |
| FDI | Future Digital Infrastructure |
| HDS | Hyperscale Datacenter System |
| NVM | Non-Volatile Memory |
| NVMe | NVM Express |
| NVMe-oF | NVMe-over-Fabric |
| PCIe | Peripheral Component Interconnect Express |

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A resource circuit board configured for use by a physical migration system, the resource circuit board comprising:
   at least one common interface shaped and configured to connect to an interconnect of a base circuit board; and
   at least one migration-support interface, the at least one common interface being different from the at least one migration-support interface, the at least one migration-support interface:
      shaped to connect to at least one corresponding migration-support interface of the physical migration system; and
      configured to provide data connectivity between the resource circuit board and a data center network during a physical migration of the resource circuit board away from the interconnect of the base circuit board to another location.

2. The resource circuit board according to claim 1, wherein the physical migration system comprises at least one robotic member and the at least one corresponding migration-support interface of the physical migration system is at the at least one robotic member.

3. The resource circuit board according claim 1, wherein the at least one migration-support interface is configured to provide the data connectivity to the resource circuit board during the physical migration of the resource circuit board.

4. The resource circuit board according to claim 1, wherein the at least one migration-support interface is configured to provide the data connectivity to the resource circuit board only during the physical migration of the resource circuit board.

5. The resource circuit board according to claim 1, wherein:
   the at least one common interface is arranged at least to support at least one application associated with at least one server utilizing the resource circuit board; and
   the at least one migration-support interface is arranged at least to support the physical migration of the resource circuit board.

6. The resource circuit board according to claim 1, wherein the at least one migration-support interface is arranged at least to support at least one of a live and a hot physical migration of the resource circuit board.

7. The resource circuit board according to claim 1, wherein the at least one common interface is shaped and configured to connect to a peripheral component interconnect of the base circuit board.

8. The resource circuit board according to claim 1, wherein the resource circuit board is configured to switch a power supply to the resource circuit board from a common power supply to a migration-support power supply, the migration-support power supply supplying power to the resource circuit board via the at least one migration-support interface and the common power supply supplying power to the resource circuit board via the at least one common interface.

9. The resource circuit board according to claim 1, wherein the at least one migration-support interface is disposed on a side of the resource circuit board that is different from a side of the resource circuit board on which the at least one common interface is disposed.

10. The resource circuit board according to claim 1, wherein the at least one migration-support interface comprises:
- at least one migration-support power interface configured to provide power to the resource circuit board during the physical migration of the resource circuit board; and
- at least one migration-support connectivity interface configured to provide the data connectivity between the resource circuit board and at least one network connection at a data center during the physical migration of the resource circuit board.

11. The resource circuit board according to claim 1, wherein the at least one migration-support interface is configured to provide the data connectivity to the resource circuit board during the physical migration of the resource circuit board via at least one of a wireless connection and a wired connection.

12. The resource circuit board according to claim 1, wherein the at least one migration-support interface comprises at least one migration-support identification interface configured with a unique identifier stored in non-transitory memory and readable by the interconnect of the base circuit board.

13. The resource circuit board according to claim 1, wherein the resource circuit board is a printed circuit board with at least one of at least one memory resource, at least one storage resource, and at least one compute resource arranged at least to support at least one application associated with at least one server utilizing the resource circuit board.

14. The resource circuit board according to claim 1, further comprising processing circuitry, the processing circuitry configured to:
- detect a connection of the at least one migration-support interface of the resource circuit board to the corresponding migration-support interface of the physical migration system; and
- as a result of detecting the connection of the at least one migration-support interface of the resource circuit board to the corresponding migration-support interface of the physical migration system, switching connectivity from the at least one common interface to the at least one migration-support interface of the resource circuit board.

15. The resource circuit board according to claim 14, wherein switching connectivity from the at least one common interface to the at least one migration-support interface comprises at least changing at least one of at least one connectivity address and at least one port of the at least one common interface to at least one of at least one connectivity address and at least one port of the at least one migration-support interface as a result of detecting the connection.

16. The resource circuit board according to claim 14, wherein switching data connectivity from the at least one common interface to the at least one migration-support interface comprises terminating communication of data to the at least one common interface and instead communicating data to the at least one migration-support interface.

17. The resource circuit board according to claim 14, wherein switching data connectivity from the at least one common interface to the at least one migration-support interface comprises participating in a handshake protocol with at least one data center network manager to switch the data connectivity.

18. The resource circuit board according to claim 17, wherein participation in the handshake protocol comprises at least clearing at least one buffer associated with the at least one common interface and, after clearing the at least one buffer, disabling the at least one common interface.

19. The resource circuit board according to claim 14, wherein the processing circuitry is further configured to:
- detect a connection of the at least one common interface to at least one destination interconnect of a destination base circuit board; and
- as a result of detecting the connection of the of the at least one common interface to the at least one destination interconnect of the destination base circuit board:
  - determine whether there is a data connection to the migration-support interface; and
  - as a result of determining that there is a data connection to the migration-support interface and simultaneously a data connection to the at least one common interface, switch data connectivity between the at least one migration-support interface of the resource circuit board to the at least one common interface of the resource circuit board.

20. A physical migration system for use at a data center, the physical migration system comprising:
- at least one movement member configured to physically migrate at least one resource circuit board from a first location to a second location, the at least one movement member having at least one migration-support interface, the at least one migration-support interface:
  - shaped to connect to a corresponding migration-support interface of the at least one resource circuit board; and
  - configured to provide data connectivity between the at least one resource circuit board and a data center network during the at least one movement member's physical migration of the at least one resource circuit board away from an interconnect of the base circuit board to another location; and
- the least one resource circuit board comprising at least one common interface shaped and configured to connect to the interconnect of a base circuit board, the at least one common interface being different from the at least one corresponding migration-support interface.

21. A method of physically migrating at least one resource circuit board, the method comprising:
- connecting at least one migration-support interface of at least one resource circuit board to at least one corresponding migration-support interface of at least one movement member, the connecting providing data connectivity between the resource circuit board and a data center network during a physical migration of the resource circuit board from a first location to a target location;
- at least a portion of the connected at least one movement member physically moving the at least one resource circuit board a distance from the first location to the target location; and
- during at least a portion of the physical movement, providing, via the connection of the at least one migration-support interface of at least one resource circuit board to the at least one corresponding migration-support interface of the at least one movement member, the data connectivity to the at least one resource circuit board.

* * * * *